US012336205B2

(12) United States Patent
Muir

(10) Patent No.: US 12,336,205 B2
(45) Date of Patent: Jun. 17, 2025

(54) AMORPHOUS METAL THIN FILM TRANSISTORS

(71) Applicant: Amorphyx, Incorporated, Corvallis, OR (US)

(72) Inventor: Sean William Muir, Corvallis, OR (US)

(73) Assignee: Amorphyx, Incorporated, Corvallis, OR (US)

( * ) Notice: Subject to any disclaimer, the term of this patent is extended or adjusted under 35 U.S.C. 154(b) by 0 days.

(21) Appl. No.: 17/513,754

(22) Filed: Oct. 28, 2021

(65) Prior Publication Data

US 2022/0262932 A1    Aug. 18, 2022

Related U.S. Application Data

(63) Continuation of application No. 16/449,181, filed on Jun. 21, 2019, now Pat. No. 11,183,585, which is a continuation of application No. PCT/US2019/024985, filed on Mar. 29, 2019.

(60) Provisional application No. 62/777,009, filed on Dec. 7, 2018, provisional application No. 62/651,014, filed on Mar. 30, 2018.

(51) Int. Cl.
*H10D 10/00* (2025.01)
*H10D 10/01* (2025.01)
*H10D 10/80* (2025.01)

(52) U.S. Cl.
CPC ......... *H10D 10/231* (2025.01); *H10D 10/041* (2025.01); *H10D 10/861* (2025.01)

(58) Field of Classification Search
CPC .......... H01L 29/7311; H01L 29/66265; H01L 29/7375
See application file for complete search history.

(56) References Cited

U.S. PATENT DOCUMENTS

| 3,654,606 A | 4/1972 | Marlowe et al. |
| 4,204,275 A | 5/1980 | Taylor |
| 5,151,691 A | 9/1992 | Kuijk |
| 5,212,537 A | 5/1993 | Birang et al. |
| 5,212,573 A | 5/1993 | Yamazaki et al. |
| 5,300,462 A | 4/1994 | Kakumu |

(Continued)

FOREIGN PATENT DOCUMENTS

| CN | 1855489 A | 11/2006 |
| CN | 1932628 A | 3/2007 |

(Continued)

OTHER PUBLICATIONS

Chang et al., "LTPO TFT Technology for AMOLEDs," *SID Symposium Digest of Technical Papers* 50(1):545-548, Jun. 2019.

(Continued)

*Primary Examiner* — Samuel A Gebremariam
(74) *Attorney, Agent, or Firm* — Seed IP Law Group LLP

(57) ABSTRACT

Described herein are various amorphous metal thin film transistors. Embodiments of such transistors include an amorphous metal gate electrode and a channel conductor formed on a non-conducting substrate. Further embodiments of such transistors include an amorphous metal source electrode, an amorphous metal drain electrode, and a channel conductor formed on a non-conducting substrate. Methods of forming such transistors are also described.

14 Claims, 31 Drawing Sheets

(56) References Cited

U.S. PATENT DOCUMENTS

| | | | |
|---|---|---|---|
| 5,744,817 A | 4/1998 | Shannon | |
| 5,893,621 A | 4/1999 | Sekiguchi | |
| 5,926,236 A | 7/1999 | den Boer et al. | |
| 6,225,968 B1 | 5/2001 | den Boer et al. | |
| 6,243,062 B1 | 6/2001 | den Boer et al. | |
| 6,512,556 B1 | 1/2003 | Sekiguchi | |
| 6,657,230 B1 | 12/2003 | Murade | |
| 6,980,468 B1 | 12/2005 | Ounadjela | |
| 7,176,869 B2 | 2/2007 | Kumada et al. | |
| 7,796,105 B2 | 9/2010 | Moon | |
| 8,035,169 B2 | 10/2011 | Ishida et al. | |
| 8,378,937 B2 | 2/2013 | Iba et al. | |
| 8,436,337 B2 | 5/2013 | Cowell, III et al. | |
| 8,575,753 B2 | 11/2013 | Choi et al. | |
| 8,822,978 B2 | 9/2014 | Cowell, III et al. | |
| 8,896,512 B2 | 11/2014 | Zebedee | |
| 9,099,230 B2 | 8/2015 | Cowell, III | |
| 9,105,609 B2 | 8/2015 | Yamazaki | |
| 9,129,927 B2 | 9/2015 | Gupta et al. | |
| 9,599,848 B2 | 3/2017 | Shih et al. | |
| 9,818,605 B2 | 11/2017 | Yan et al. | |
| 9,818,765 B2 | 11/2017 | Osawa et al. | |
| 10,020,354 B2 | 7/2018 | Kim et al. | |
| 10,234,734 B2 | 3/2019 | Cowell, III et al. | |
| 10,438,841 B2 | 10/2019 | Muir | |
| 10,476,515 B2 | 11/2019 | Englekirk | |
| 10,672,898 B2 | 6/2020 | Muir | |
| 10,777,448 B2 | 9/2020 | Muir | |
| 10,971,392 B2 | 4/2021 | Muir | |
| 11,069,799 B2 | 7/2021 | Muir | |
| 11,610,809 B2 | 3/2023 | Muir | |
| 11,741,913 B2 | 8/2023 | Muir et al. | |
| 2003/0161181 A1 | 8/2003 | Saito et al. | |
| 2003/0223535 A1 | 12/2003 | Leedy | |
| 2005/0083321 A1 | 4/2005 | Boer | |
| 2005/0225543 A1 | 10/2005 | Boer | |
| 2005/0260803 A1* | 11/2005 | Halik | H10K 10/468 |
| | | | 257/E29.151 |
| 2005/0275038 A1* | 12/2005 | Shih | H01L 29/78648 |
| | | | 257/382 |
| 2006/0012000 A1 | 1/2006 | Estes et al. | |
| 2006/0028591 A1 | 2/2006 | Kim | |
| 2007/0108446 A1 | 5/2007 | Akimoto | |
| 2008/0138949 A1 | 6/2008 | Fumitake | |
| 2008/0239791 A1 | 10/2008 | Tran | |
| 2009/0015151 A1 | 1/2009 | Ishihara et al. | |
| 2009/0134467 A1 | 5/2009 | Ishida et al. | |
| 2010/0059742 A1 | 3/2010 | Shieh et al. | |
| 2010/0123744 A1 | 5/2010 | Iba et al. | |
| 2010/0289005 A1* | 11/2010 | Cowell, III | H01L 29/7311 |
| | | | 257/29 |
| 2010/0298005 A1 | 11/2010 | Yavuz et al. | |
| 2010/0301480 A1 | 12/2010 | Choi et al. | |
| 2011/0063229 A1 | 3/2011 | Krah et al. | |
| 2011/0127525 A1 | 6/2011 | Yamazaki et al. | |
| 2012/0061663 A1 | 3/2012 | Yamazaki et al. | |
| 2012/0074399 A1 | 3/2012 | Den Boer et al. | |
| 2013/0037798 A1* | 2/2013 | Wong | H01L 29/7869 |
| | | | 438/164 |
| 2013/0175520 A1* | 7/2013 | Lan | H01L 29/4908 |
| | | | 257/E29.296 |
| 2013/0288426 A1 | 10/2013 | Akimoto et al. | |
| 2014/0048797 A1 | 2/2014 | Yu et al. | |
| 2014/0191197 A1 | 7/2014 | Cowell, III et al. | |
| 2014/0264672 A1 | 9/2014 | Park et al. | |
| 2014/0293166 A1 | 10/2014 | Shih et al. | |
| 2014/0302310 A1 | 10/2014 | Cowell, III et al. | |
| 2014/0368310 A1 | 12/2014 | Cowell, III | |
| 2015/0054799 A1 | 2/2015 | Chang et al. | |
| 2015/0055047 A1 | 2/2015 | Chang et al. | |
| 2015/0115260 A1 | 4/2015 | Shieh et al. | |
| 2015/0340511 A1 | 11/2015 | Yan et al. | |
| 2015/0364563 A1* | 12/2015 | Mieno | H01L 29/4925 |
| | | | 257/57 |
| 2016/0043227 A1* | 2/2016 | Zhang | H01L 29/78696 |
| | | | 257/43 |
| 2016/0268526 A1 | 9/2016 | Facchetti et al. | |
| 2017/0146873 A1 | 5/2017 | Onogi et al. | |
| 2017/0205656 A1 | 7/2017 | Lee et al. | |
| 2018/0061867 A1 | 3/2018 | Chang et al. | |
| 2018/0203309 A1 | 7/2018 | Cowell, III et al. | |
| 2018/0306744 A1 | 10/2018 | Malecha et al. | |
| 2018/0308744 A1 | 10/2018 | Muir | |
| 2019/0086280 A1* | 3/2019 | Jeon | G01K 7/186 |
| 2019/0088167 A1* | 3/2019 | Jeon | G09G 3/3233 |
| 2019/0312063 A1 | 10/2019 | Yamazaki et al. | |
| 2019/0385895 A1 | 12/2019 | Muir | |
| 2021/0151346 A1 | 5/2021 | Muir | |
| 2022/0229194 A1 | 7/2022 | Chen et al. | |

FOREIGN PATENT DOCUMENTS

| | | |
|---|---|---|
| CN | 101015066 A | 8/2007 |
| CN | 105264618 A | 1/2016 |
| EP | 0 434 627 A2 | 6/1991 |
| JP | H2-137828 A | 5/1990 |
| JP | H5-102147 A | 4/1993 |
| JP | H6-230746 A | 8/1994 |
| JP | H7-50697 B2 | 5/1995 |
| JP | H10-84146 A | 3/1998 |
| JP | H11-74467 A | 3/1999 |
| JP | H11-305267 A | 11/1999 |
| JP | 2001-265255 A | 9/2001 |
| JP | 2003347308 A | 12/2003 |
| JP | 2008-004588 A | 1/2008 |
| JP | 2009-130167 A | 6/2009 |
| JP | 2010073877 A | 4/2010 |
| JP | 2010-123338 A | 6/2010 |
| KR | 20080035360 A | 4/2008 |
| KR | 10-2015-0084879 A | 7/2015 |
| KR | 20180025988 A | 3/2018 |
| KR | 20180054924 A | 5/2018 |
| WO | 9602867 A1 | 2/1996 |
| WO | 2005106927 A2 | 11/2005 |
| WO | 2017/066332 A1 | 4/2017 |
| WO | 2017205656 A1 | 11/2017 |
| WO | WO 2017194720 A1 | 11/2017 |
| WO | 2018/009901 A1 | 1/2018 |
| WO | 2020/118268 A1 | 6/2020 |

OTHER PUBLICATIONS

Den Boer, "6.2: A Select Line Driver for the Offset-Scan-and-Hold Dual Select Diode AMLCDs," *Society for Information Display Symposium Digest of Technical Papers* 32(1):44-47, 2001.

Den Boer, "Are There Alternatives to TFTs in AMLCDs?" *SID Information Display* 10:2-5, 2006.

Diode-connected transistor, URL=https://en.wikipedia.org/w/index.php?title=Diode-connected transistor&oldid=828667878, download date Jun. 17, 2020.

Grubbs et al., "Development and characterization of high temperature stable Ta—W—Si—C amorphous metal gates," *Applied Physics Letters* 97(22):223505, 2010. (3 pages).

Heiblum et al., "Ballistic hot-electron transistors," *IBM Journal of Research and Development* 34(4):530-549, 1990.

Heiblum, "Tunneling Hot Electron Transfer Amplifiers (Theta): Amplifiers Operating up to the Infrared," *Solid-State Electronics* 24(4):343-366, 1981.

Jeong et al., "Low-Temperature Polysilicon Oxide Thin-Film Transistors with Coplanar Structure Using Six Photomask Steps Demonstrating High Inverter Gain of 264 V V$^{-1}$," *Advanced Engineering Materials* 22(4):1901497, Apr. 2020.

Kim et al., "A Memory-in-Pixel Circuit for Low-Power Liquid Crystal Displays With Low Temperature Poly-Silicon and Oxide Thin Film Transistors," *IEEE Electron Device Letters* 40(12):1957-1960, Dec. 2019.

Matsukawa et al., "Suppressing $V_t$ and $G_m$ Variability of FinFETs Using Amorphous Metal Gates for 14 nm and Beyond," *International Electron Devices Meeting*, San Francisco, California, USA, Dec. 10-13, 2012, p. 8.2.1-8.2.4.

(56) References Cited

OTHER PUBLICATIONS

Mead, "Operation of Tunnel-Emission Devices," *Journal of Applied Physics* 32(4):646-652, 1961.
Nelson et al., "Hot-Electron Transfer through Thin-Film Al-Al$_2$O$_3$ Triodes," *Journal of Applied Physics* 37(1):66-76, 1966.
Ohmori et al., "Impact of Additional Factors in Threshold Voltage Variability of Metal/High-k Gate Stacks and Its Reduction by Controlling Crystalline Structure and Grain Size in the Metal Gates," *International Electron Devices Meeting*, San Francisco, California, USA, Dec. 15-17, 2008, pp. 1-4.
Torres, Jr. et al., "High-Current Gain Two-Dimensional MoS$_2$-Base Hot-Electron Transistors," *Nano Letters* 15(12):7905-7912, 2015.
Vaziri et al., "A Graphene-Based Hot Electron Transistor," *Nano Letters* 13(4):1435-1439, 2013.
Vaziri et al., "Going ballistic: Graphene hot electron transistors," *Solid State Communications* 224:64-75, 2015.
Watakabe et al., "Development of Advanced LTPS TFT Technology for Low Power Consumption and Narrow Border LCDs," *SID Symposium Digest of Technical Papers* 50(1):541-544, Jun. 2019.
Zeng et al., "Vertical Graphene-Base Hot-Electron Transistor," *Nano Letters* 13(6):2370-2375, 2013.
Yang et al., "New Progress of Low-Temperature Metal-Induced Crystallized Polycrystalline Silicon Thin-Film," *Chinese Journal of Spectroscopy Laboratory* 30(5):2246-2250, Sep. 2013. (with English Abstract).
"Electronic paper," Wikipedia, archive date Jan. 31, 2023, URL= https://en.wikipedia.org/w/index.php?title=Electronic_paper&oldid=871367267, download date Aug. 11, 2022. (11 pages.).
Mizukami et al., "36.1: 6-Bit Digital VGA OLED," *SID Symposium Digest of Technical Papers*, 31(1):912-915, Jul. 5, 2012.

* cited by examiner

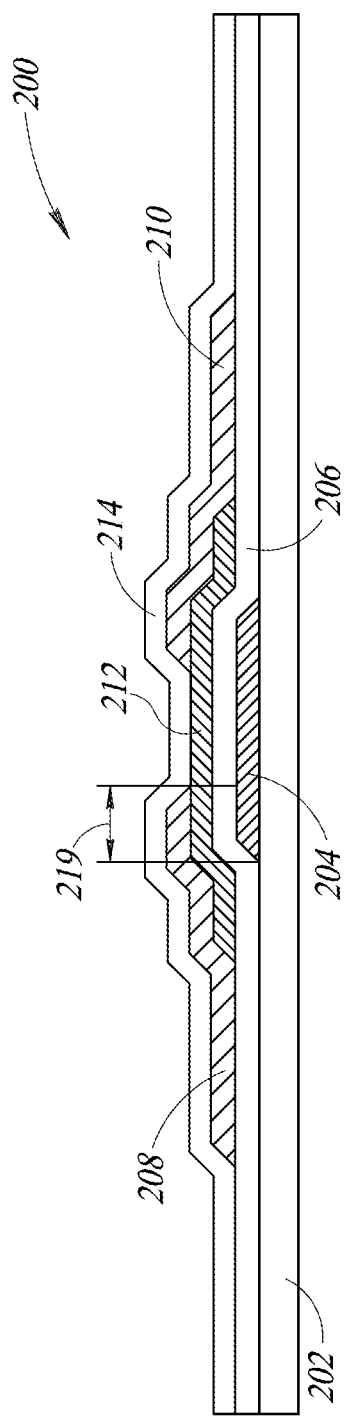
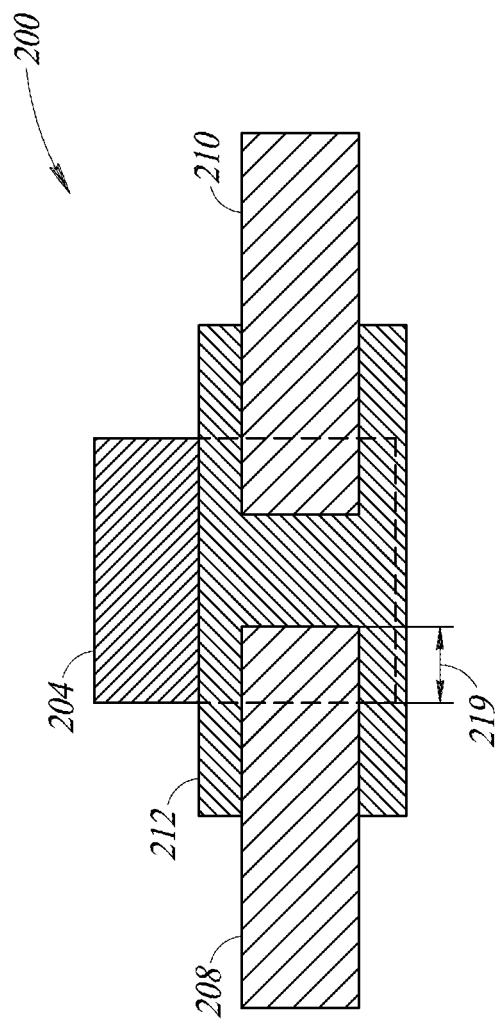
FIG. 2A
FIG. 2B

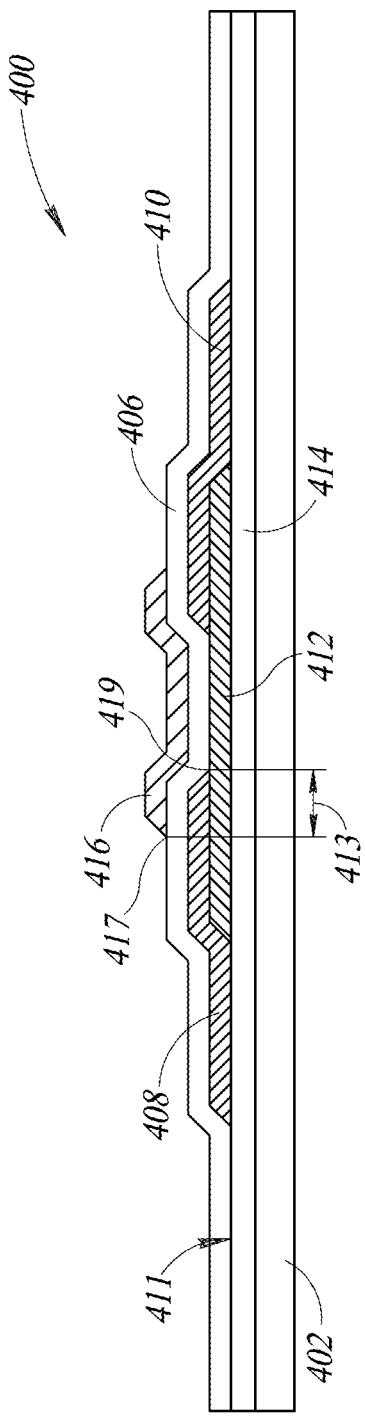
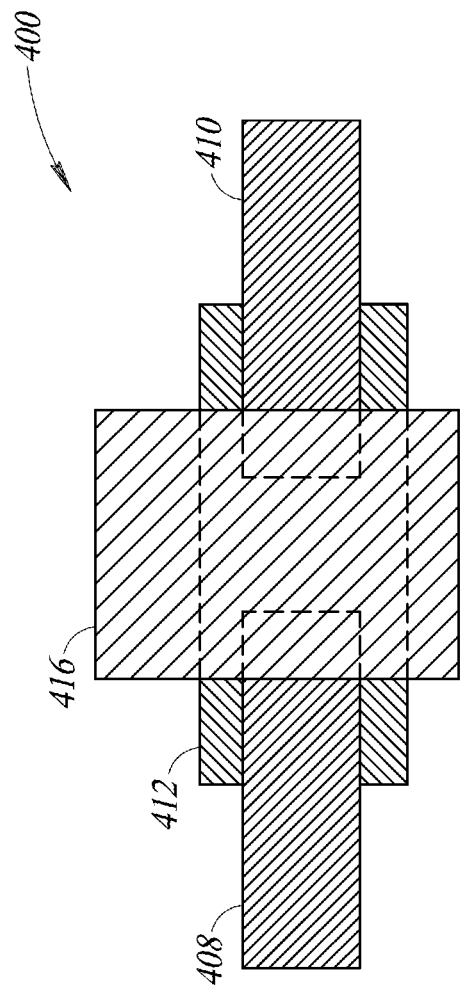
FIG. 4A
FIG. 4B

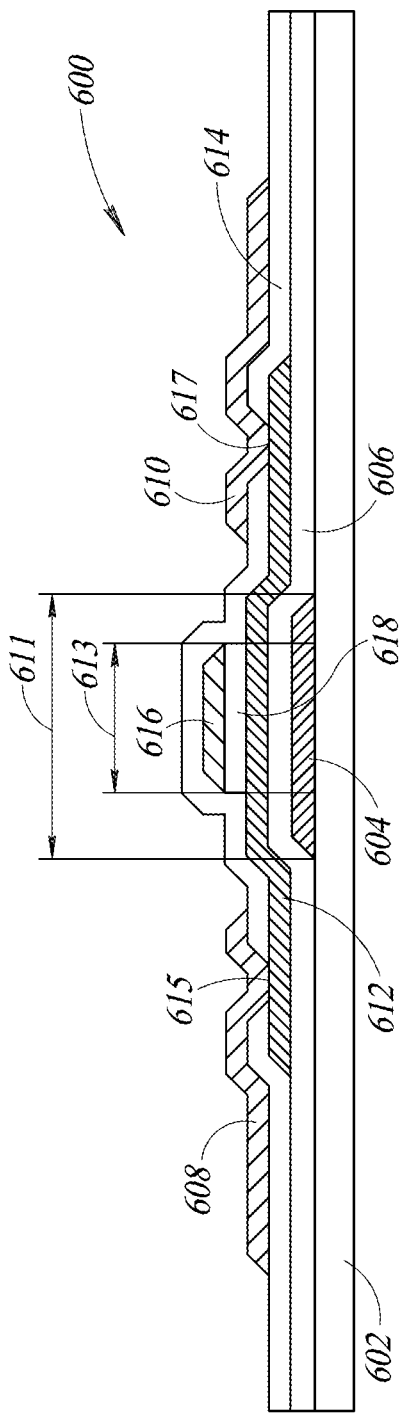
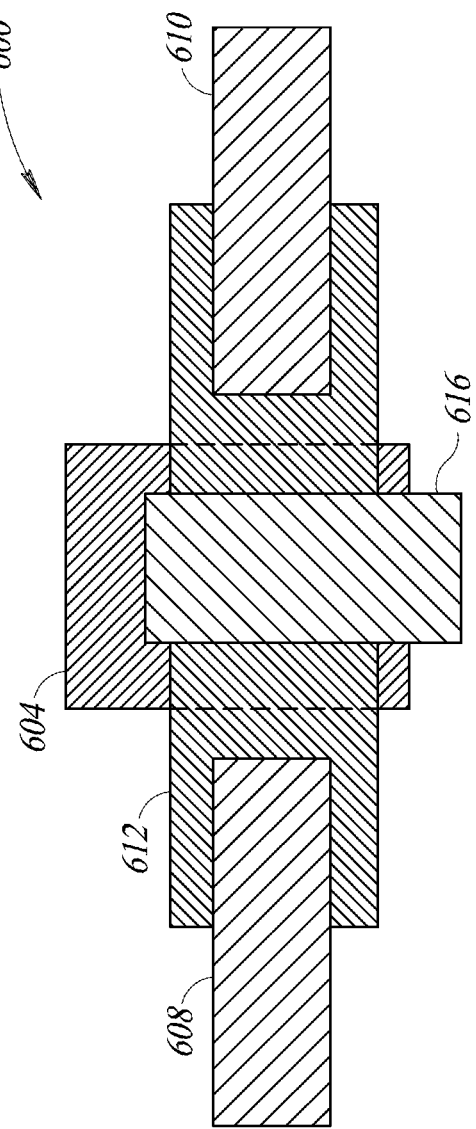
FIG. 6A
FIG. 6B

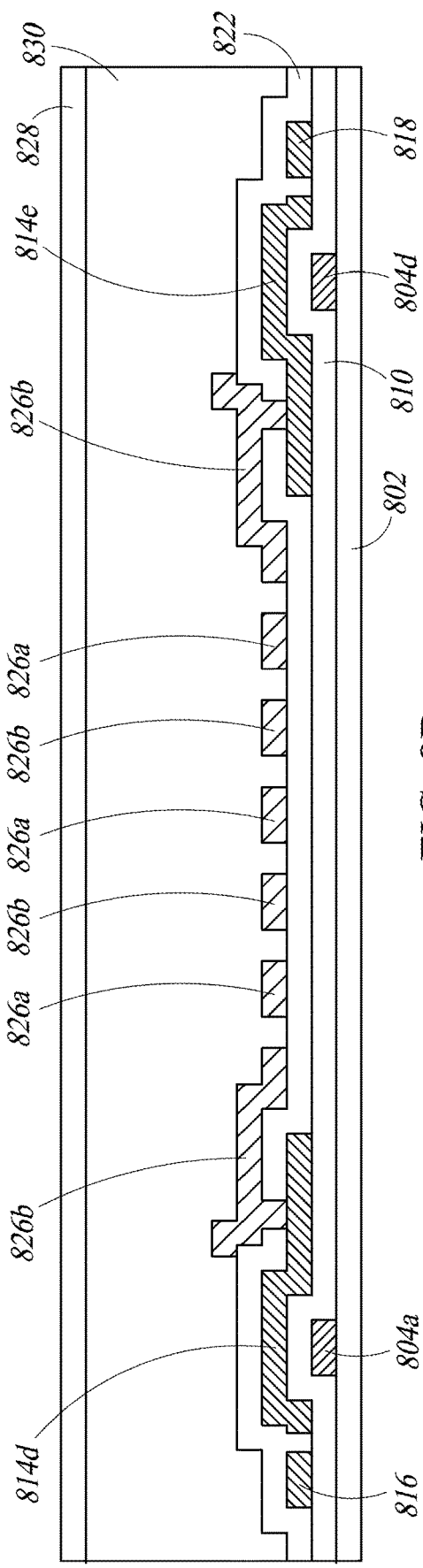
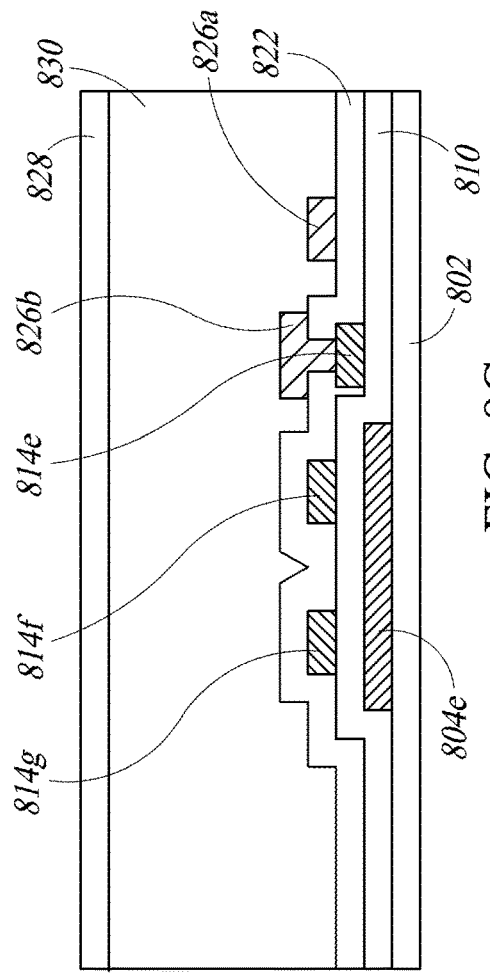
FIG. 8B
FIG. 8C

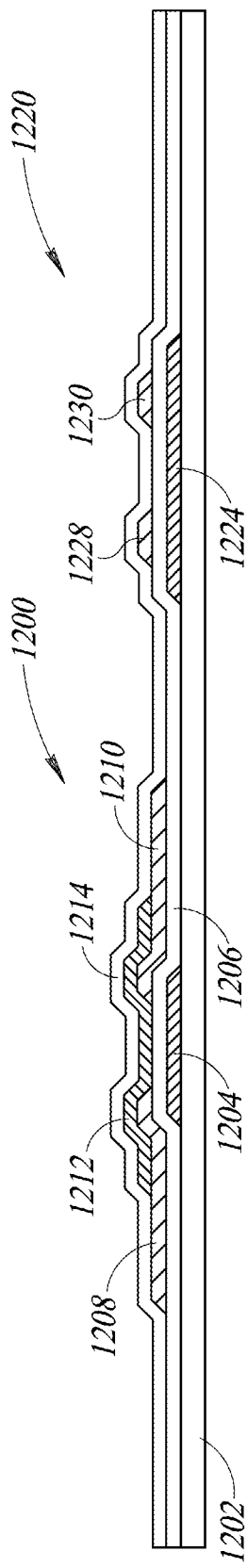
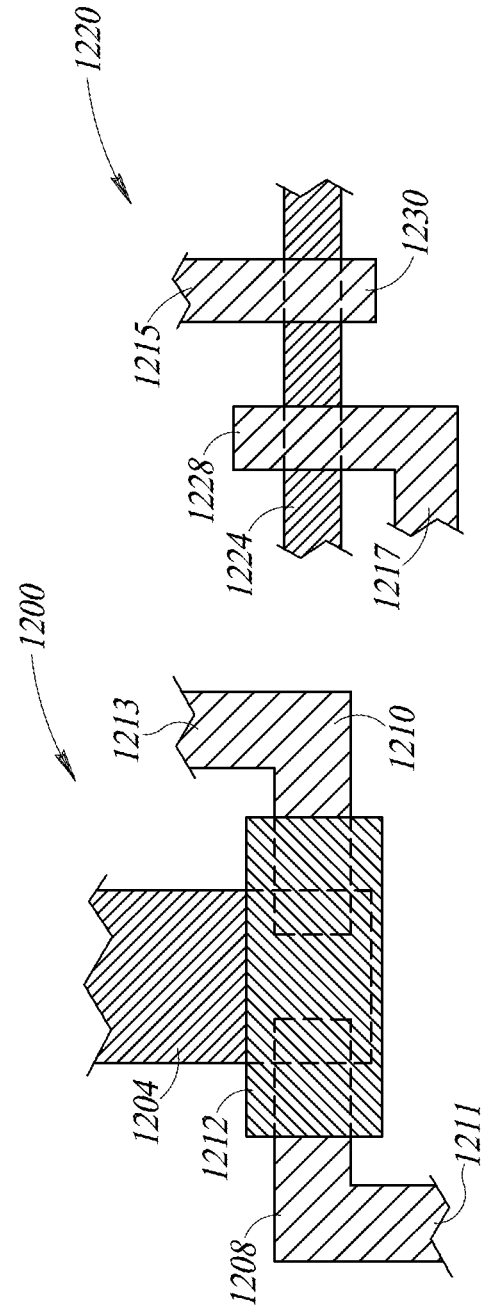
FIG. 12A
FIG. 12B

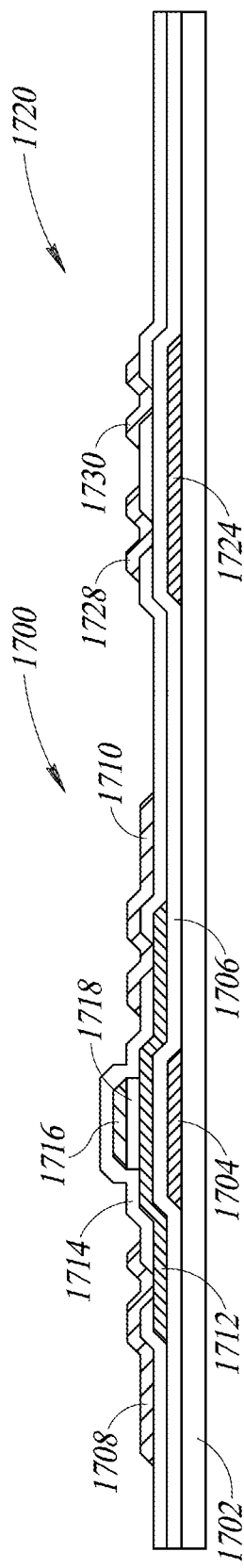
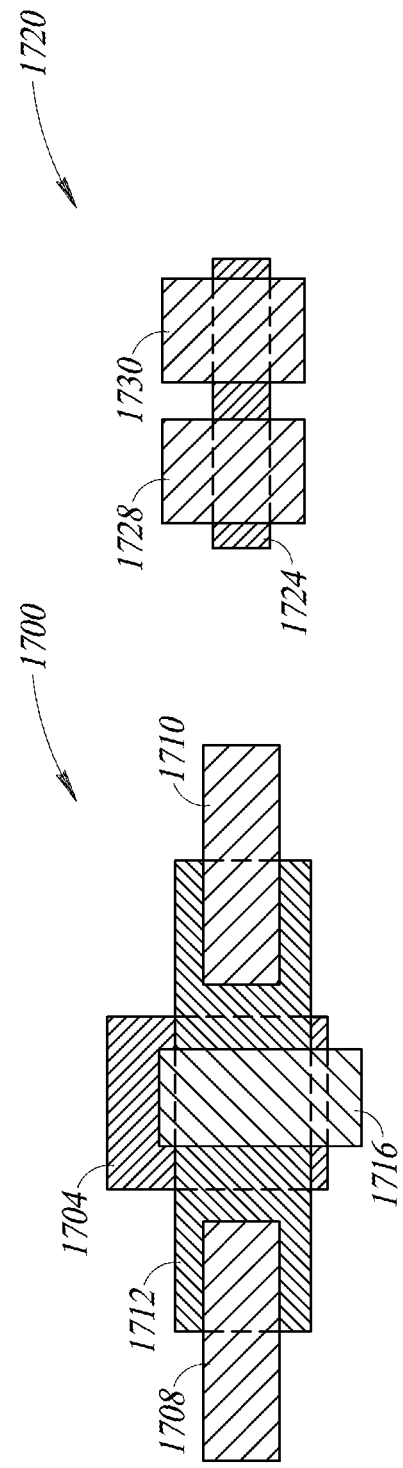
FIG. 17A
FIG. 17B

|  | INPUTS | | | OUTPUTS |
| --- | --- | --- | --- | --- |
| PHASE | CLK | S(B) | R(A) | Q(OUT) |
| 1 | 1 | 0 | 1 | 0 |
| 2 | 0 | 0 | 1 | 0 |
| 3 | 0 | 1 | 0 | 0 |
| 4 | 1 | 1 | 0 | 1 |

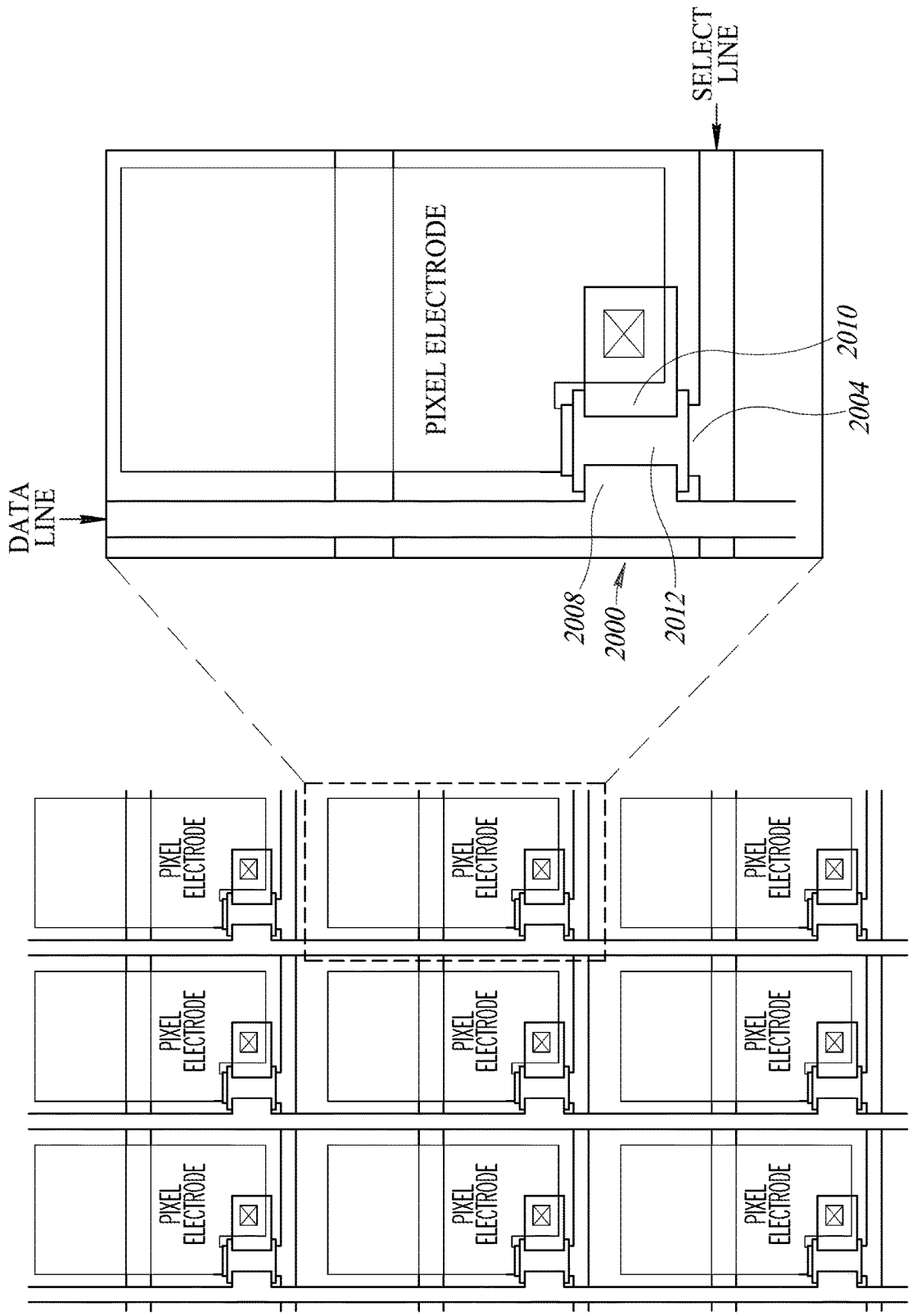

AMORPHOUS METAL THIN FILM TRANSISTORS

BACKGROUND

Technical Field

The present disclosure relates to microelectronic devices that incorporate one or more layers of an amorphous metal film in a thin film transistor.

Description of the Related Art

Amorphous metals are rigid solid materials whose atomic structure lacks long-range periodicity that characterizes crystalline materials. In an amorphous metal, formation of crystalline planes is suppressed, for example, by incorporating two or more components. An example of an amorphous metal having four components—zirconium, copper, aluminum, and nickel—is $Zr_{55}Cu_{30}Al_{10}Ni_5$, is described in U.S. Pat. No. 8,436,337. Amorphous metals can be identified by their resistivity measurements, which have shown that an amorphous metal material, while still conductive, has about ten times greater resistivity than its crystalline counterpart. Amorphous metals also have smoother surfaces than crystalline metals, as indicated by root mean square (RMS) surface roughness measurements.

Amorphous multi-component metallic films (AMMFs), in the range of about 10-200 nm, can be used to improve performance of electronic components such as resistors, diodes, and thin film transistors. These AMMFs can be formed using standard deposition processes. The exemplary amorphous metal noted above, $Zr_{55}Cu_{30}Al_{10}Ni_5$, is an AMMF that can be formed on a substrate by conventional sputter deposition using four different metal targets. As a result, electric fields at an interface of an AMMF and an oxide film are more uniform.

Such uniformity has produced superior current-voltage (I-V) characteristic curves for metal-insulator-metal (MIM) diodes and transistors that exhibit Fowler-Nordheim tunneling. The tunneling MIM diodes incorporate an AMMF as a lower electrode and a crystalline metal film as an upper electrode. The two electrodes are separated by a single dielectric barrier that provides a tunneling pathway for charge carriers to move between the electrodes. The single dielectric barrier results in a current response that depends on the polarity of an applied voltage. At a specific voltage the charge carriers in the device are only tunneling in one direction, i.e., one-way tunneling. That is, tunneling occurs either from the lower electrode to the upper electrode, or from the upper electrode to the lower electrode, according to the polarity of the applied voltage. Various diode and transistor applications of AMMFs are discussed in U.S. Pat. Nos. 8,436,337 and 8,822,978.

Amorphous metal thin film non-linear resistors (AMNRs), having superior performance to existing thin film non-linear resistors, are discussed in U.S. Pat. No. 9,099,230 and PCT Patent Application No. WO2014/074360. The current response of these AMNRs is independent of the polarity of the applied voltage, which is not true for other thin film resistors. This polarity independence is due to the presence of two dielectric barriers, where the charge carriers at each barrier are forced to tunnel in substantially opposite directions. AMNRs exhibit two-way tunneling because, in response to an applied voltage, the charge carriers in the device tunnel in both directions across the barriers. That is, tunneling occurs from the upper electrode to the lower electrode and from the lower electrode to the upper electrode, regardless of the polarity of the applied voltage. Such polarity-symmetric AMNRs may provide improved signal control in liquid crystal display (LCD) or organic light emitting diode (OLED) display technologies and electromagnetic sensor arrays.

BRIEF SUMMARY

The present disclosure is directed to devices and systems that include amorphous metal thin film transistors (AMTFT), as well as methods of forming the same.

These AMTFTs are thin, high performing devices that can replace transistors in display technology, such as control transistor for pixels in a flat panel display. As these devices can be made very efficiently, such as covering a smaller footprint relative to common transistor technologies, this will leave greater than 50% pixel window area for light to pass through.

In various embodiments, devices of the present disclosure include an amorphous metal thin film transistor (AMTFT) on a support substrate. The support substrate can be a non-conducting substrate, which is more cost effective than silicon or semiconducting substrates. For example, the support substrate could be aluminum borosilicate glass, fused silica, or other suitable non-conducting material.

If the substrate is conductive, an insulator may be formed on a surface of the substrate between the surface and a first electronic component on the substrate. For example, if a silicon or semiconductor substrate is used, a native oxide or other insulator is on the surface of the substrate to isolate the silicon from the first electronic component to ensure non-conductivity.

The support substrate can be any one of a variety of materials, such as a glass substrate, silicon or other semiconductor substrate, or a flexible substrate, including polymers (e.g., rubber or plastic). In various embodiments, the substrate is flexible. In some such embodiments, the transistor is made entirely of amorphous materials (i.e., amorphous metal gate, source, and drain electrodes, amorphous metal-oxide insulator, and amorphous metal-oxide semiconductor).

In embodiments, a transistor of the present disclosure includes at least one amorphous metal layer. Any suitable amorphous metal may be used. In embodiments, an amorphous metal used includes Zr, Cu, Ni, Al, or a combination thereof. For example, the amorphous metal layer may be an alloy of titanium and aluminum. In some embodiments, the alloy is $TiA_3$, $TiAl_7$, $TiAl$, or a combination thereof. In particular embodiments, the alloy is $TiA_3$. In particular embodiments, the alloy is $TiA_3$, i.e. aluminum with 25% of the atoms replaced by titanium. In other embodiments, the amorphous metal layer is an alloy of Cu, Zr, or both (e.g., CuZrB).

In various embodiments, the amorphous metal layer is formed on the support substrate. In some such embodiments, the surface of support substrate onto which the amorphous metal layer is formed is a planar surface. This planar surface in conjunction with the homogenously smooth surfaces of amorphous metal layers, allow the amorphous metal gate electrode to have a surface that is homogenously smooth, which results in fewer surface imperfections. This is in comparison to crystalline metals. Surface imperfections in crystalline metals cause inhomogeneity in the electric field, which can lead to failure of the electronic device.

In some embodiments, the amorphous metal layer is or is formed into an amorphous metal gate structure. Accordingly, in embodiments, an AMTFT of the present disclosure includes an amorphous metal gate and a channel conductor. In various embodiments, the channel conductor is a semiconductor material. In some embodiments, the channel conductor is an oxide. In specific embodiments, the channel conductor is InGaZnO.

In embodiments, an AMTFT further includes source and drain electrodes. Such electrodes may be crystalline, amorphous, multi-material stack, etc., as understood by one of skill in the art. The source and drain electrodes can be crystalline metals or other suitable conductors. In some embodiments, the material can be metals (e.g., Al, Mo, etc.) or semiconductor materials (e.g., polysilicon). In some embodiments, the material can be highly conductive aluminum based materials. These electrodes could be atomically thin, such as graphene layers. In embodiments, the source/drain electrodes have the same thickness and material properties. In an alternative embodiment, the source electrode is a different conductive material than the drain electrode. In this embodiment, the source/drain electrodes may be formed in different steps. The source/drain electrodes can have different thicknesses, different material properties, and different dimensions that depend on the product in which this transistor is incorporated.

In some embodiments, the amorphous metal layer is or is formed into source and drain electrodes. Accordingly, in embodiments, an AMTFT of the present disclosure includes an amorphous metal source and drain electrodes, and a channel conductor. Thus, in embodiments, an AMTFT of the present disclosure includes gate, source, and drain electrodes of amorphous metal.

In embodiments, the transistor further includes a first tunneling insulator. The first tunneling insulator is generally a very thin layer, e.g., no more than about 20 nanometers (nm).

BRIEF DESCRIPTION OF THE SEVERAL VIEWS OF THE DRAWINGS

The detailed description is described with reference to the accompanying figures. The sizes and relative positions of elements in the figures are not necessarily drawn to scale. For example, the shapes of various elements and angles are not drawn to scale and some of these elements are enlarged and positioned to improve figure legibility. As is understood by one of skill in the art, the shape of a particular element may be modified (e.g., rounded, thinned, elongated, etc.) to suit a particular application.

FIG. 2A is a cross-sectional view of an AMTFT according to another embodiment of the present disclosure. FIG. 2B is a top-down view of features of the AMTFT of FIG. 2A.

FIG. 4A is a cross-sectional view of an AMTFT according to another embodiment of the present disclosure. FIG. 4B is a top-down view of features of the AMTFT of FIG. 4A.

FIG. 6A is a cross-sectional view of an AMTFT according to another embodiment of the present disclosure. FIG. 6B is a top-down view of features of the AMTFT of FIG. 6A.

FIGS. 8A, 8B, and 8C are views of a pixel with in plane switching according to an embodiment of the present disclosure.

FIG. 12A is a cross-sectional view of an AMTFT formed adjacent to an amorphous metal non-linear resistor (AMNR) according to an embodiment of the present disclosure. FIG. 12B is a top-down view of features of the AMTFT and AMNR of FIG. 12A.

FIG. 17A is a cross-sectional view of an AMTFT formed adjacent to an AMNR according to an embodiment of the present disclosure. FIG. 17B is a top-down view of features of the AMTFT and AMNR of FIG. 17A.

FIG. 20B shows a top down view of an illustrative matrix of AMLCD or EPD circuits. FIG. 20C shows a single pixel circuit of the array, as indicated by the rectangle in FIG. 20B.

DETAILED DESCRIPTION

Figure 1A:
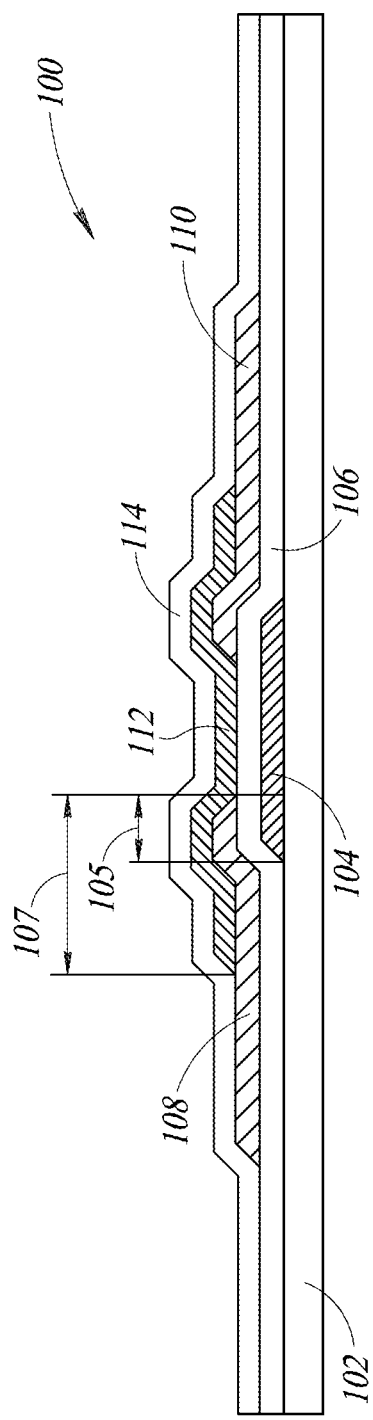
FIG. 1A is a cross-sectional view of an amorphous metal thin film transistor (AMTFT) according to one embodiment of the present disclosure.

It will be appreciated that, although specific embodiments of the present disclosure are described for purposes of illustration, various modifications may be made without departing from the spirit and scope of the present disclosure.

In this description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

The present disclosure is directed to various implementations of a transistor that incorporates amorphous metal thin films. Amorphous metal thin films, used in conjunction with a tunneling insulating layer perform transistor functions without the complexity of standard, silicon based transistors. Such amorphous metal transistors can be formed on any number of support substrates, giving flexibility to designers with regard to the types of materials and products that can incorporate transistors, i.e., active circuitry. These amorphous metal transistors can be formed on flexible substrate as they can bend and change shapes without damage to the circuitry. These flexible substrates may be polymers, glass or other materials.

Many aspects of our lives are benefited by utilizing ever smaller electronic devices. These include televisions, mobile electronic devices, like cellular phones, smart phones, tablet computers, and wearable electronics, like smart watches and pedometers. The transistors built on semiconductor substrates are limited by the materials used to form these circuits, i.e., silicon or other semiconductor wafers. With flexible transistors, the potential uses of electronic devices can be further expanded and improved, such as lighter and faster displays, wearable displays, mobile or easily movable displays, integrated into internet-of-things applications, or be integrated in to medical devices.

These transistor structures can be used to form high-performance analog devices or digital devices as the end application dictates. Further, because these transistor structures do not use semiconductor materials, countless applications of non-semiconductor based transistors are possible. As will be described in this disclosure, semiconductor materials can be utilized, however, the transistor structures themselves are not based on doping a silicon wafer and instead incorporate forming amorphous metal thin films on any number of support substrates.

Figure 1B:
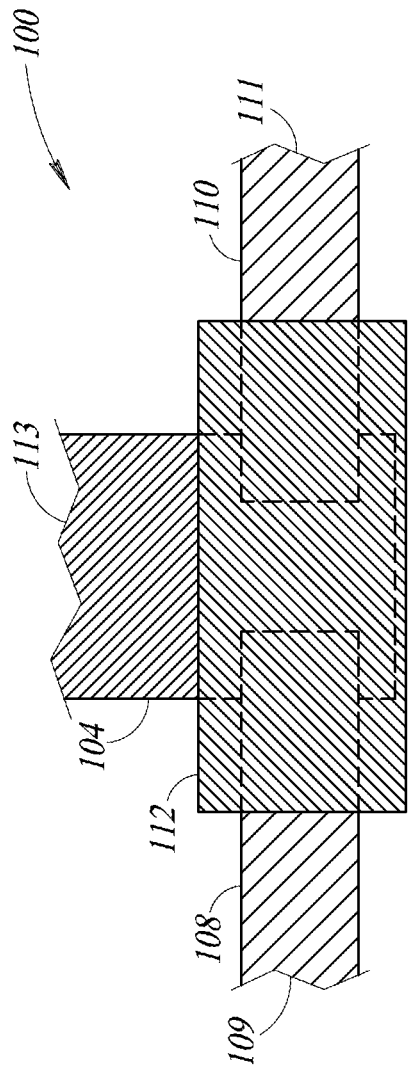
FIG. 1B is a top-down view of features of the AMTFT of FIG. 1A.

FIG. 1A is a first embodiment of an AMTFT having a cross-sectional view of an AMTFT structure 100 formed on a support substrate 102. FIG. 1B is a top down view of the AMTFT structure 100 of FIG. 1A. The structure 100 includes an amorphous metal gate electrode 104 on the support substrate 102 and a first tunneling insulator 106 on the amorphous metal gate electrode 104. Source/drain electrodes 108 and 110 (e.g., crystalline metal, amorphous metal, multi-material stack, etc.) are on the first tunneling insulator 106. The source/drain electrodes 108, 110 overlap the amorphous metal gate electrode 104 by at least a first distance 105. A channel conductor 112 (which could be a semiconductor) overlaps the source/drain electrode 108, 110 by at least a second distance 107. A second insulator 114 is optionally deposited on the channel conductor 112.

The substrate 102 can be a variety of materials, such as conductive, semiconductive, or nonconductive materials. As a result of the transistor structures having nontraditional materials, the substrate can have nontraditional properties. For example, the substrate can be deformable or bendable such that it can return to its resting shape. The transistor structures can also operate in a curved or bent configuration.

In some embodiments, the substrate is glass, a polymer, plastic, or other material. In other embodiments, the substrate is a rubber. As used herein, "rubber" includes polymers of isoprene as well as forms of polyisoprene. In some such embodiments, the substrate is a plastic. Any suitable plastic may be used. In some embodiments, the plastic is an arylamide, acrylamide, polybenzimidazole (PBI), polyetherimide, polyetherketoneketone (PEKK), polyether ether ketone (PEEK), polyamide, polyimide, polyamide-imides, polystyrene (PS), polyphenylene oxide (PPO), polyphthalamide (PPA), polyvinyl alcohol (PVA), acrylonitrile butadiene styrene (ABS), polycarbonate (PC), thermoset, PBI-PEEK, urea, epoxies, polyurethanes, or any combination thereof. In some embodiments, the plastic is a polyethylene. In particular embodiments, the plastic is a high density polyethylene.

Figure 26A:
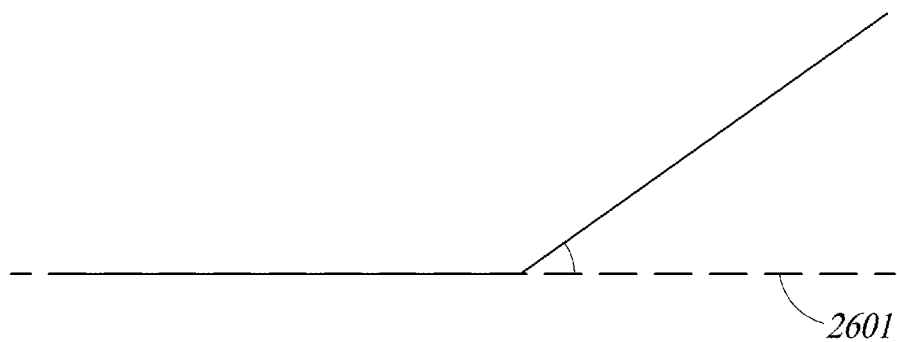
FIGS. 26A and 26B show schematics of angles that can be measured in flexible substrates that are deformed.
Figure 26B:
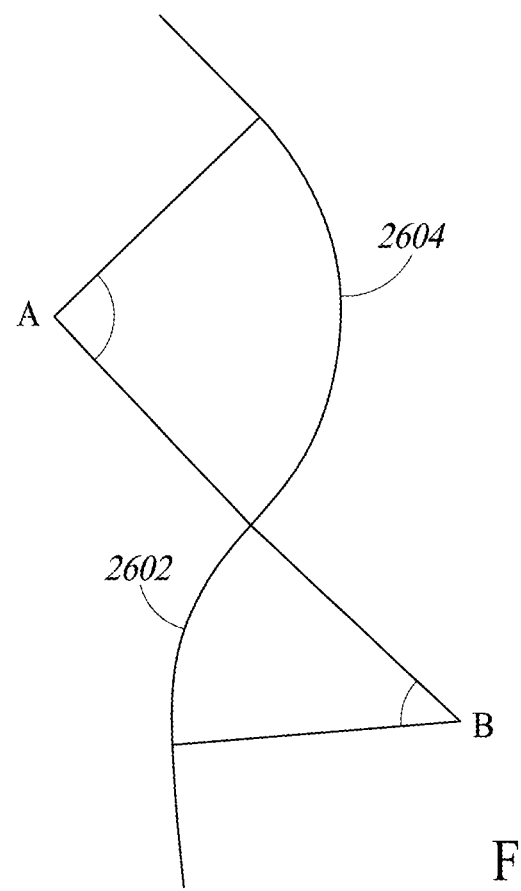

In further embodiments, the flexible substrate can be deformed (e.g., bowed, rolled, etc.) to form a curve having a central angle of at least about 5 degrees. In some embodiments, the flexible substrate can be deformed (e.g., bowed, rolled, etc.) to form a curve having a central angle of at least about 10 degrees. Unless otherwise specified, the central angle is measured for a curve in relation to an apex of the curve. In embodiments where a substrate is deformed in more than one location, a corresponding number of curves can be measured, as illustrated in FIG. 26B, which includes a first curve 2604 and a second curve 2602 corresponding to angle A and angle B, respectively. In some embodiments, the flexible substrate can be deformed (e.g., bowed, rolled, etc.) to form a curve having a central angle of at least about 10 degrees in each of the first and second curve. Said differently, the substrate can be bent, contoured, or otherwise moved into a shape suitable for the end use. The transistor structures formed on this flexible substrate can be used in the bent or contoured shape. It is also envisioned that such transistors can be formed on a rigid substrate should the end use be suitable for a non-flexible substrate.

In embodiments, an AMTFT is formed while a flexible substrate is in a planar arrangement. In some such embodiments, the flexible substrate can then be deformed (e.g., bent, rolled, bowed, etc.) without damaging the AMTFT structures.

The materials of the support substrate can be selected by the manufacturer based on the end application of the transistor structure and the ultimate device being manufactured. For example, if the transistor structure is incorporated with an array of transistor structures, the array could be implemented within a liquid crystal display. Other end applications include wearable electronics. The support substrate can be transparent or non-transparent, such as those that can be used in some reflective displays.

Manufacturing on non-conducting flexible support substrates can reduce manufacturing costs significantly. Such substrates can enable roll-to-roll manufacturing of transistors. Such manufacturing changes can redefine the electronic supply chain.

An amorphous metal layer is formed on the substrate. The amorphous metal gate electrode 104 is formed by removing excess portions of the amorphous metal layer. The forming of the amorphous metal layer may include any film-forming technique such as sputtering, solution deposition, or electron-beamed deposition. For example, multi-source RF (or DC) magnetron sputtering using elemental or mixed composition metal targets of Zr, Cu, Ni, and Al may be employed. Sputter deposition affords a distinct manufacturing advantage over similarly smooth semiconductors deposited using advanced epitaxial technologies such as molecular beam epitaxy (MBE) or metal-organic chemical vapor deposition (MOCVD).

As described above, portions of the amorphous metal layer are etched or otherwise removed such as with masks, photo lithography and other techniques. In other embodiments, the amorphous metal layer may be deposited in the shape suitable for the application. The amorphous metal layer can be deposited at room temperature via sputtering and can maintain the amorphous and smooth properties in subsequent heating steps. The adaptability and flexibility of the amorphous metal layers in methods of formation and methods of use make the possible applications endless.

In embodiments with an amorphous metal gate on a flexible substrate, it is envisioned that the flexible substrate be deformed (e.g., bent) to an angle of at least about +/−5 degrees from a plane 2601 formed by the substrate 102 in a planar or resting position. Unless otherwise specified, all angles described in terms of a measurement in degrees are measured from the plane 2601 (as indicated by the dashed line in FIG. 26A).

The first tunneling insulator 106 is on the amorphous metal gate electrode 104. In some embodiments, portions of the first tunneling insulator 106 layer between the source/drain electrodes 108, 110 and the amorphous metal gate electrode 104 may be thinner than other portions.

The first tunneling insulator 106 is formed as a conformal layer, which may be by a blanket deposition. This is the simplest, most cost effective manufacturing option, however, the first tunneling insulator 106 may be patterned as suitable for the end application of the transistor structure.

The tunneling insulator can be any suitable insulator, including an oxide, a nitride, silicon nitride, metal oxides (e.g., aluminum oxide), etc. In embodiments, the first tunneling insulator is a metal oxide (e.g., $Al_2O_3$) or metal nitride that can be formed in a very thin layer. The first tunneling insulator is sufficiently thin so as to enable tunneling and the generation of hot electrons. In some embodiments, portions of the first tunneling insulator layer between the source/drain electrodes and the amorphous metal gate electrode may be thinner than other portions. In particular embodiments, the first tunneling insulator is an aluminum oxide layer that is no more than 10 nm deposited by atomic layer deposition.

In various embodiments, an AMTFT of the present disclosure includes a second insulator. The second insulator can be any suitable insulator, including an oxide, a nitride, silicon nitride, metal oxides, etc.

Subsequently, the source/drain electrodes 108, 110 are formed on the first tunneling insulator 106. Each of the source/drain electrodes overlaps the amorphous metal gate electrode 104 by at least the distance 105. FIGS. 1A and 1B show one configuration of the source/drain electrodes relative to the amorphous metal gate electrode. Other configurations and orientations are possible. In order to achieve the electron movement, the electrodes overlap the amorphous metal gate electrode in some amount.

In one embodiment, the source electrode is formed at the same time as the drain electrode. This can be by a blanket deposition and then an etching step. As such, the source/drain electrodes have the same thickness and material properties. In an alternative embodiment, the source electrode is a different conductive material than the drain electrode and formed in different steps. The source/drain electrodes can have different thicknesses, different material properties, and different dimensions that depend on the product in which this transistor is incorporated.

The channel conductor 112 is on the source/drain electrodes 108, 110. The channel conductor 112 overlaps the source/drain electrodes 108, 110 by the distance 107. FIGS. 1A and 1B show one embodiment of the configuration of the channel conductor 112 relative to the source/drain electrodes 108, 110, and the first tunneling insulator 106. Other configurations and orientations are possible.

Some embodiments of methods of the disclosure include forming the second insulator 114 on the source/drain electrodes 108, 110. The second insulator 114 covers all exposed surfaces and is ideally conformal. This layer may be a protective for the transistor structure. Other structures maybe formed on the transistors, however, there are implementations where these are single device layered structures. In other variations, an opening may be formed in the second insulator 114 to expose a surface of the source/drain electrodes 108, 110 to which electrical connections may be made. In the single device layer implementations, the electrical connections to the gate, source, and drain are made in line from ends 109, 111, and 113.

The ultra-smooth amorphous metal gate electrode used in this embodiment provides better electric field control across the AMTFT gate insulator when compared to traditional thin film transistors, which use a rough crystalline metal electrode for the gate.

Another embodiment of an AMTFT is shown in FIG. 2A, which is a cross-sectional view of AMTFT structure 200 formed on a support substrate 202. FIG. 2B is a top down view of the AMTFT structure 200 of FIG. 2A. The structure 200 includes an amorphous metal gate electrode 204 on the support substrate 202 and a first tunneling insulator 206 on the amorphous metal gate electrode 204. A channel conductor 212 is on the first tunneling insulator 206. Source/drain electrodes 208, 210 are arranged, in part, on the channel conductor 212 and, in part, on a surface of the first tunneling insulator 206. The source/drain electrodes 208, 210 overlap the amorphous metal gate electrode 204. A second insulator 214 is optionally deposited over the source/drain electrodes 208, 210.

In FIG. 2A and FIG. 2B, the gate 204 is separated from the channel conductor 212 by the tunneling insulator 206. The source/drain electrodes 208/210 are separated from the channel conductor by the tunneling insulator 206. There is a region 219 of overlap of the gate 204, the channel conductor 212, and the source/drain electrode 208. The source/drain electrodes 208/210 may be formed in direct contact with the channel conductor 212. This region of overlap 219 is where the electrons will flow during operation through the tunneling oxide.

Figure 3A:
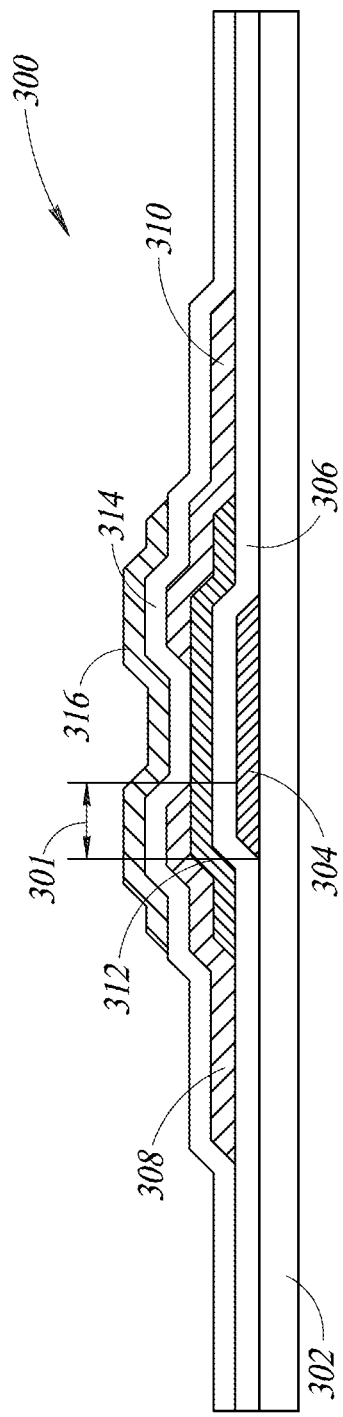
FIG. 3A is a cross-sectional view of an AMTFT according to another embodiment of the present disclosure.
Figure 3B:
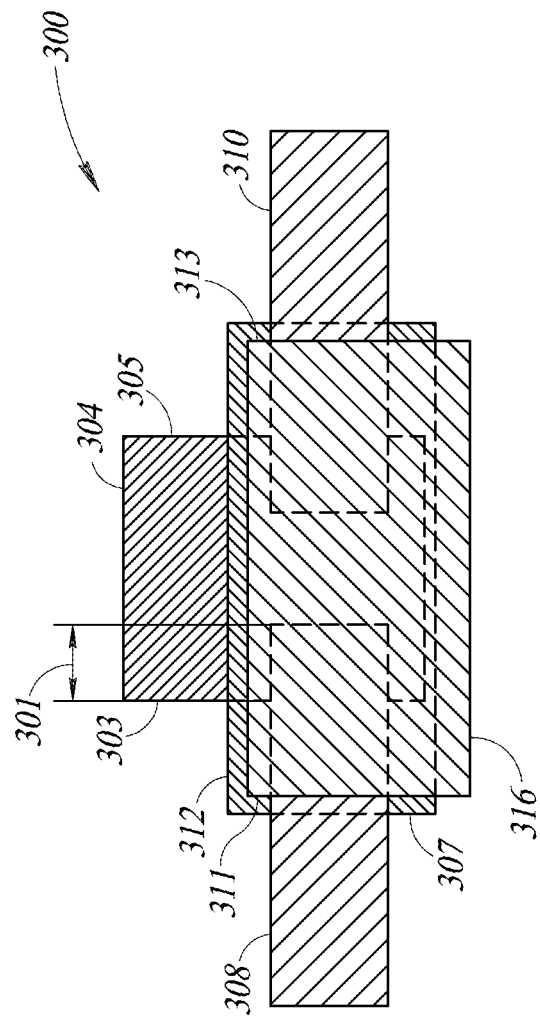
FIG. 3B is a top-down view of features of the AMTFT of FIG. 3A.

A further embodiment of an AMTFT is shown in FIG. 3A, which is a cross-sectional view of AMTFT structure 300, and FIG. 3B, which is a top down view of the AMTFT structure 300 of FIG. 3A, formed on a support substrate 302. This is a gate first device, where the gate is closest to the substrate as compared to the other layers described below. The structure 300 includes a first amorphous metal gate electrode 304 on the support substrate 302 and a first tunneling insulator 306 on the first amorphous metal gate electrode 304. A channel conductor 312 is formed on the first tunneling insulator 306. Source/drain electrodes 308, 310 overlap the channel conductor 312 and the first amorphous metal gate electrode 304. A region 301 of overlap of the gate, the channel, and the source/drain electrodes provides a path for electron movement.

It is noted that all channel conductors described herein may be formed of a semiconductor material, using standard semiconductor processing techniques as beneficial for the end application. Other conductive materials may be used as a channel. The source/drain electrodes of this disclosure may also be a variety of materials. In some embodiments, the source/drain electrodes may be crystalline materials. In other embodiments, the source/drain electrodes may be amorphous materials, such as an amorphous metal. In yet other embodiments, the source/drain electrodes may be a multi-layer stack of materials, such as a stack of metal layers.

In some embodiments, portions of the first tunneling insulator layer 306 between the source/drain electrodes 308, 310 and the first amorphous metal gate electrode 304 may be thinner than other portions. For example, the first tunneling insulator layer 306 can be thinned in the region 301 to reduce a distance between the source/drain 308, 310 and the gate 304. In this configuration, the insulating layer has indentations and the channel conductor 312 is formed in these indentations. These indentations in the tunneling insulator may be applied to any of the embodiments described herein.

A second insulator 314 is deposited over the source/drain electrodes 308, 310. A second gate electrode 316 is deposited on the second insulator 314. The second gate electrode 316 may be metal, such as crystalline metal, amorphous metal, or multi-material stack. The second gate electrode 316 is substantially aligned with the amorphous metal gate electrode 304 and the channel conductor 312. The second gate electrode 316 extends at least over the region 301. The second gate 316 may be incorporated into other embodiments. In this embodiment, the second gate 316, extends past ends 303, 305. In some embodiments, the second gate 316 has ends 311, 313 positioned between the end 303 of the first gate and an end 307 of the channel conductor 312. In embodiments, the second gate electrode enhances device performance.

Yet another embodiment of an AMTFT is shown in FIG. 4A, which is a cross-sectional view of AMTFT structure 400 in a gate last method of forming. FIG. 4B is a top down view of the AMTFT structure 400 of FIG. 4A. The structure 400 includes a first insulator 414 on a support substrate 402. This may be formed by a blanket deposition to coat the entire substrate or the surface of the substrate to be processed to form the transistor. A channel conductor 412 is formed on the first insulator 414. It is noted that the sidewalls of the various layers are illustrated in a sloped configuration. These sidewalls may be more vertically oriented, more similar to a perpendicular to the surface 411 of the first insulator. The sidewalls are transverse to the surface of the insulator. The sidewalls of each of the layers of each of the embodiments may be at different angles than those illustrated.

Source/drain electrodes 408, 410 overlap the channel conductor 412. In a preferred embodiment, the source/drain electrodes are amorphous metal. A second insulator 406, a tunneling insulator, is formed on source/drain electrodes 408, 410. The second insulator is in direct contact with the amorphous metal of the source/drain electrodes. A gate electrode 416 is formed on the second tunneling insulator 406. The gate electrode 416 may be metal, such as crystalline metal, amorphous metal, or multi-material stack. In embodiments, the gate electrode 416 is substantially aligned with the channel conductor 412. In embodiments, the gate electrode 416 is aligned between source/drain electrodes 408, 410. An active area, a region of overlap 413 is between at least the end 417 of the gate 416 and an end 419 of the source/drain electrode 408.

The gate 416 is furthest from the substrate in the embodiment in FIG. 4A. The tunneling insulator 406 is between the gate and the source/drain electrodes 408/410. The channel is separated from the gate by the source/drain electrodes 408/410.

Figure 5A:
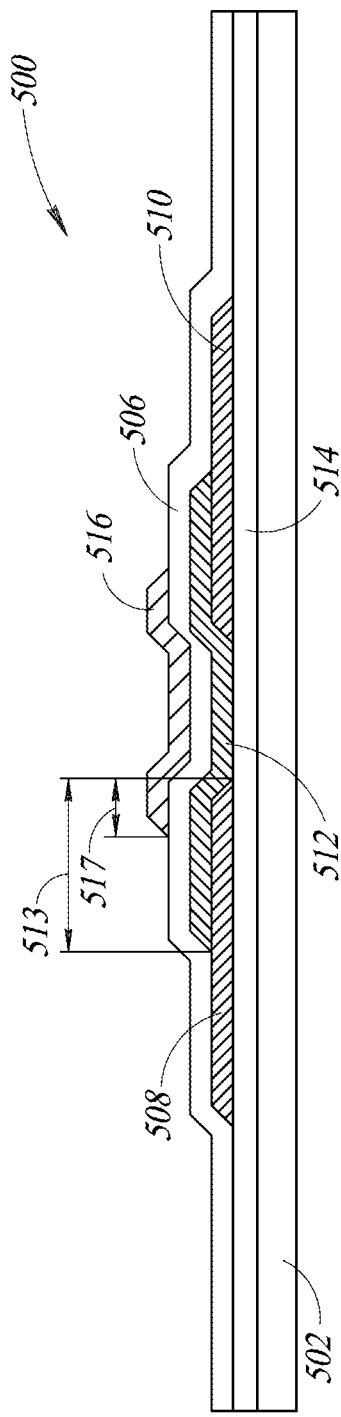
FIG. 5A is a cross-sectional view of an AMTFT according to another embodiment of the present disclosure.
Figure 5B:
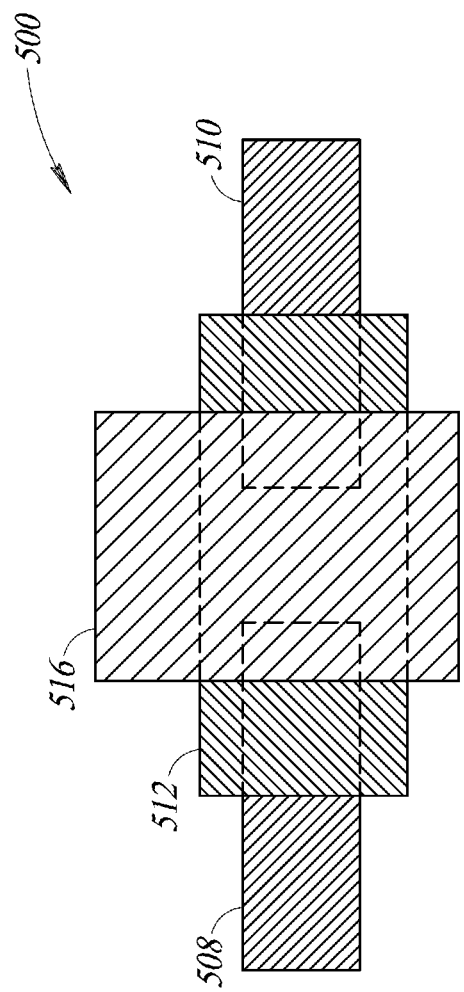
FIG. 5B is a top-down view of features of the AMTFT of FIG. 5A.

Another embodiment of an AMTFT is shown in FIG. 5A, which is a cross-sectional view of AMTFT structure 500, and FIG. 5B, which is a top down view of the AMTFT structure 500 of FIG. 5A, formed on a support substrate 502. This is a gate last configuration. The structure 500 includes a first insulator 514 on the support substrate 502. Source/drain electrodes 508, 510, which are formed of amorphous metal, are formed on the first insulator 514. A channel conductor 512 overlaps source/drain electrodes 508, 510 at a region 513. The channel conductor is in direct contact with the source/drain electrodes, which may be a conformal layer that overlaps and covers all exposed places during deposition.

A second tunneling insulator 506 is formed on channel conductor 512, and on source/drain electrodes 508, 510. A gate electrode 516 is deposited over the second tunneling insulator 506. The gate electrode 516 may be metal, such as crystalline metal, amorphous metal, or multi-material stack. The tunneling insulator performs well when in direct contact with the amorphous metal, which in this embodiment is the source/drain electrodes. In embodiments, the gate electrode 516 is substantially aligned with the channel conductor 512, having an overlap region 517. In embodiments, the gate electrode 516 is aligned between source/drain electrodes 508, 510 and overlaps the source/drain electrodes to some extent.

For each of the illustrated embodiments, the top down views provide ends of the various components that are coupled to other components in the final product. These couplings can be through vias, other overlapping layers, or other coupling techniques that allow electrical signals to pass to these transistor structures. A further embodiment of an AMTFT is shown in FIG. 6A, which is a cross-sectional view of AMTFT structure 600, and FIG. 6B, which is a top down view of the AMTFT structure 600 of FIG. 6A, formed on a support substrate 602. The structure 600 includes an amorphous metal gate electrode 604 on the support substrate 602 and a first tunneling insulator 606 on the amorphous metal gate electrode 604. A channel conductor 612 is formed on the first tunneling insulator 606. A second tunneling insulator 618 is deposited on channel conductor 612. The channel conductor 612 and the gate electrode 604 overlap in region 611.

In embodiments, the second tunneling insulator 618 is substantially aligned and completely overlaps a middle region of the amorphous metal gate electrode 604. A second gate electrode 616 is on the second tunneling insulator 618. In embodiments, the second gate electrode 616 is substantially aligned with the amorphous metal gate electrode 604, such that a midline of each is aligned. A region 613 corresponds to an area of overlap of the first gate with the second gate. The second gate electrode 616 may be metal, such as crystalline metal, amorphous metal, or a multi-material stack.

The second dielectric layer 618 is patterned and removed or otherwise shaped to correspond to dimensions of the second gate electrode 616. A third insulator 614 is on the second gate electrode 616. In embodiments, the third insulator layer 614 is discontinuous, such that the channel conductor 612 is exposed in locations 615, 617. These locations or openings allow for direct coupling to the channel conductor 612 by source/drain electrodes 608, 610. The source/drain electrodes 608, 610 are formed over third insulator layer 614 and overlap the channel conductor 612. In some embodiments, the second gate electrode and the source/drain electrodes 608, 610 may be formed at the same time, such that they are formed after the third insulator layer.

Figure 7:
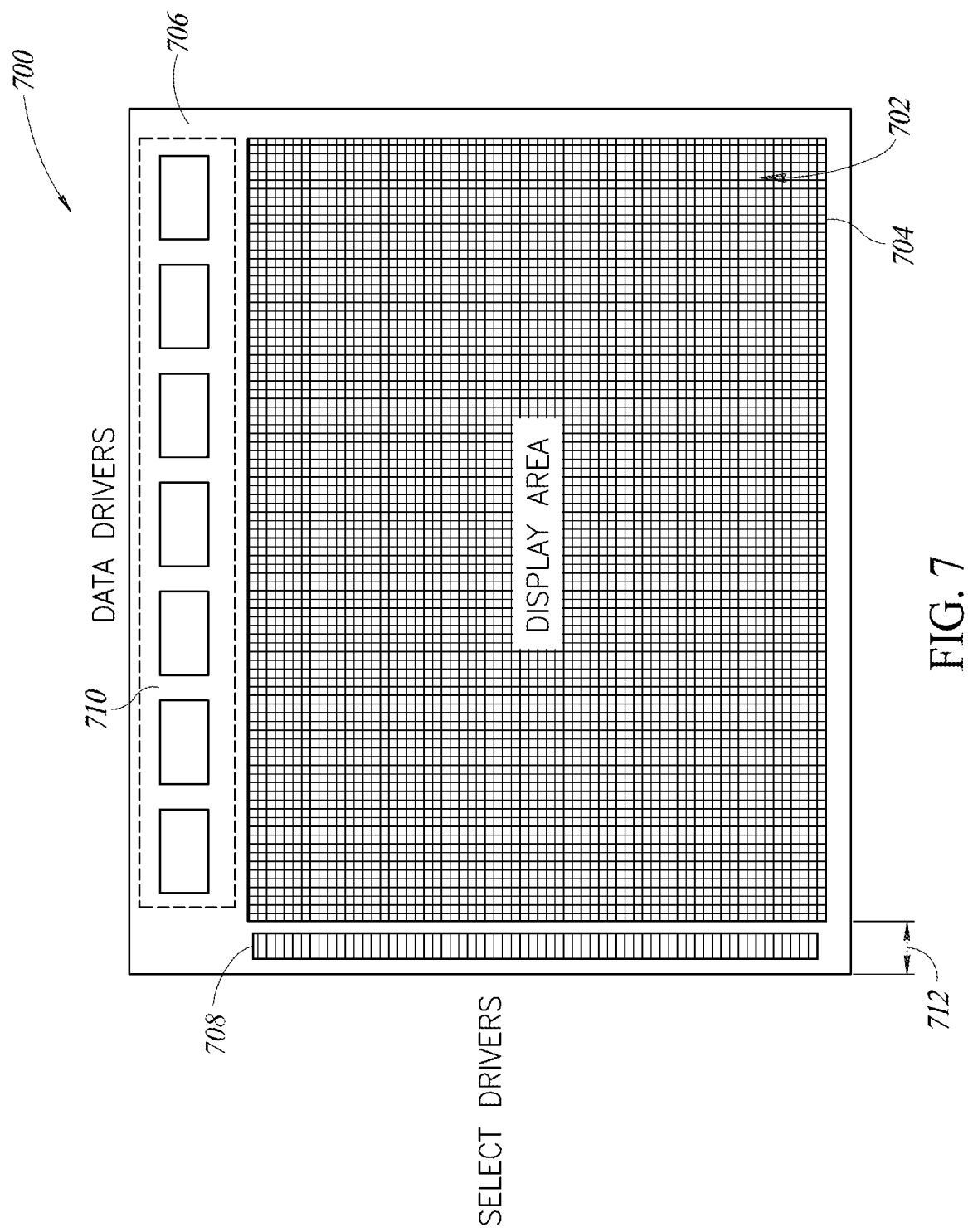
FIG. 7 shows a display formed in accordance with the present disclosure.

FIG. 7 is a display 700 that may include AMTFTs of the present disclosure. The display 700 includes a display region 702 that includes a plurality of pixels 704. This display may be on a flexible or a rigid substrate 706. In some embodiments, the substrate is glass. The display may be a flat panel display that forms images, such as videos, television, or other digital media.

Each pixel of the flat panel display is controlled by thin film transistors, such as AMTFTs or amorphous metal non-linear resistors (AMNRs) or a combination of both. These pixels receive two signals, one signal activates a switch, i.e. the AMTFT or the AMNR, and the other signal sets a brightness while the switch is activated. Select drivers 708 are coupled to the pixels and activate the switch. These select drivers are sometimes referred to as gate drivers. The select drivers are on the left side of the display area as illustrated.

Data drivers 710 control the brightness of the pixels. In known systems, the data drivers and the select drivers are bulky individually packaged chips. These groups of chips take up considerable area on edges of the substrate 706. These also add cost as the display manufacturers often purchase these chips from other silicon chip manufacturers. The select drivers of the present disclosure, made with the AMTFTs of the present disclosure are formed during the same process steps as the pixels, also formed from AMTFTs or AMNRs. This results in significant reduction in bezels of the display. A distance 712 between an edge of the display area 702 to an edge of the glass can be significantly reduced as compared to current display technology. This area currently must accommodate a plurality of integrated circuits soldered or otherwise coupled to the substrate and the pixels. It is noted that in some embodiments, the pixel can be formed exclusively with AMNRs if desired. It is also envisioned that the pixel can be formed exclusively with AMTFTs.

AMTFT allow the select drivers to be formed directly on the display glass. This allows the bezel of the glass around the display area to be made thinner and eliminates separate integrated circuits. In various embodiments, the sub-pixels in the display area are controlled by amorphous metal thin film non-linear resistor (AMNR) devices. In various embodiments, the sub-pixels in the display area are controlled by amorphous hot electron transistor (AMHET). In various embodiments, the sub-pixels in the display area are controlled by AMTFT devices.

In some embodiments both the select drivers and data drivers are formed directly on the glass, during the manufacturing of the pixels, using AMNR, AMTFT, and AMHETs. As mentioned above, the amorphous metals provide very smooth surfaces. These smooth surfaces impact the electric field control across a gate insulator, like the tunneling insulator. In addition, transistors of the present disclosure can be formed from amorphous materials, i.e., the gate and the source/drain electrodes are amorphous metal, the insulator is an amorphous metal-oxide, and the channel is an amorphous metal-oxide semiconductor. These all amorphous transistors and other circuitry offer mechanical flexibility.

Figure 8A:
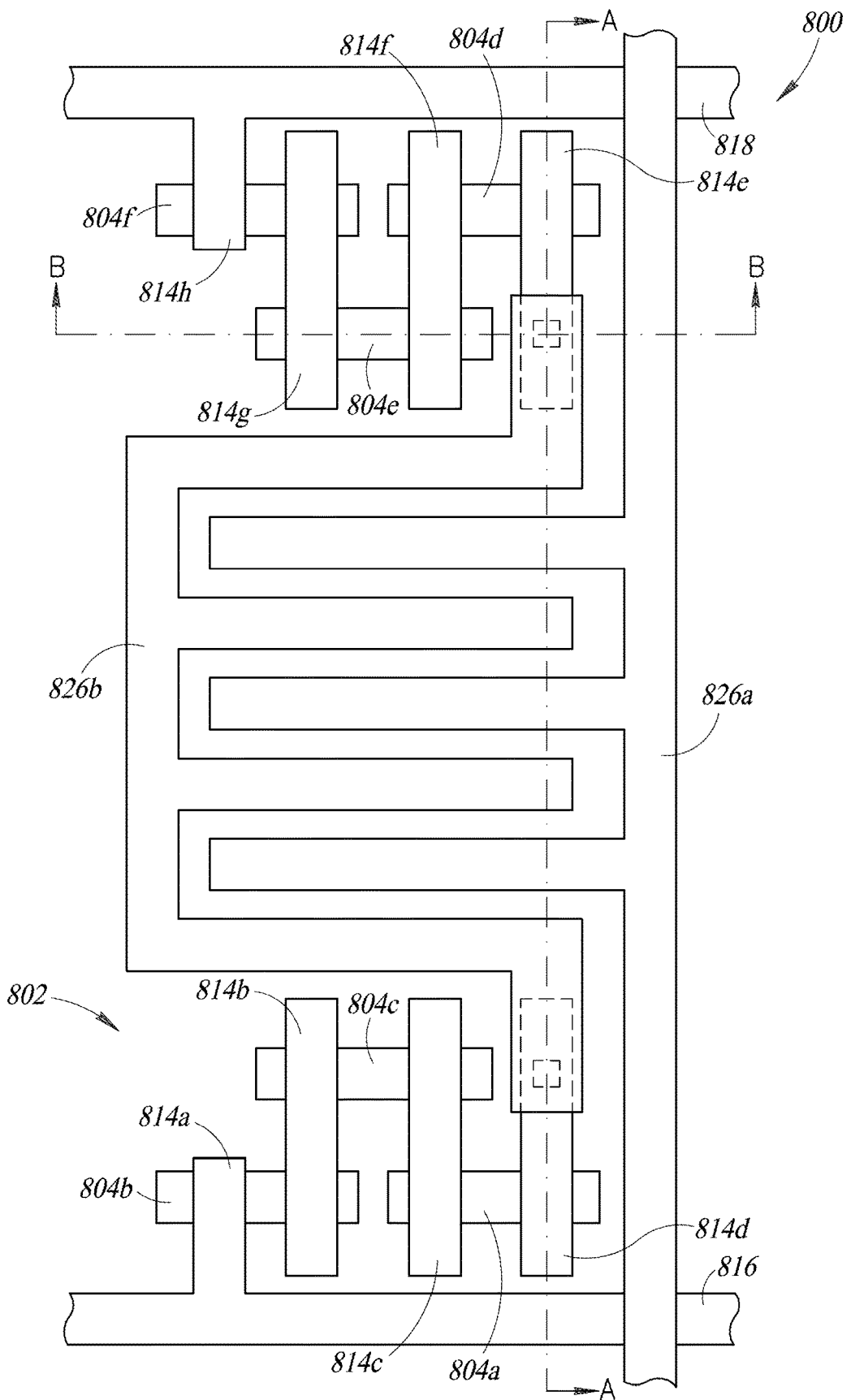

FIGS. 8A, 8B, and 8C are top and cross-sectional views of a pixel 800 including AMNR devices. These devices can be used for in-plane switching (IPS). As used in the disclosure, pixel may refer to a pixel or a sub-pixel. The select drivers or other transistors used to control and drive the pixels and sub-pixels can be formed as AMTFTs of the present disclosure. As described below, AMTFTs can be coupled to AMNR devices to control and drive various pixels.

FIG. 8A is a top view of a pixel 800 that includes a plurality of AMNR devices 802. FIG. 8B is a cross-sectional view of the pixel 800 through the line A-A. FIG. 8C is a cross-sectional view of the pixel 800 through the line B-B. The pixel 800 is formed on a substrate 802, which is transparent or otherwise able to transmit light from a light source, which can be any one of the substrates discussed in this disclosure. A first plurality of interconnects 804a-804f are formed on the substrate 802. In this embodiment, the first plurality of interconnects 804a-804f are all formed of an amorphous metal thin film.

A first tunnel insulator 810 is formed over the first plurality of interconnects. A second plurality of interconnects 814a-814h are formed on the first tunnel insulator 810. Select lines 816 and 818 can be formed at the same time as the second plurality of interconnects 814a-814h.

A second insulator 822 is formed on the second plurality of interconnects 814a-814h. The second insulator may be a different material than the first tunnel insulator. A plurality of in-plane electrodes 826a and 826b are formed on the second insulator. A top glass layer 828 is positioned over an LCD layer 830. The electrode 826a is also a data line. With this in-plane switching configuration, the data line is formed on the substrate as opposed to on the top glass layer 828. The electrodes 826a and 826b are formed to have a comb fingered shape. There may be fewer or greater numbers of comb fingers as the application of this pixel may dictate.

Figure 9:
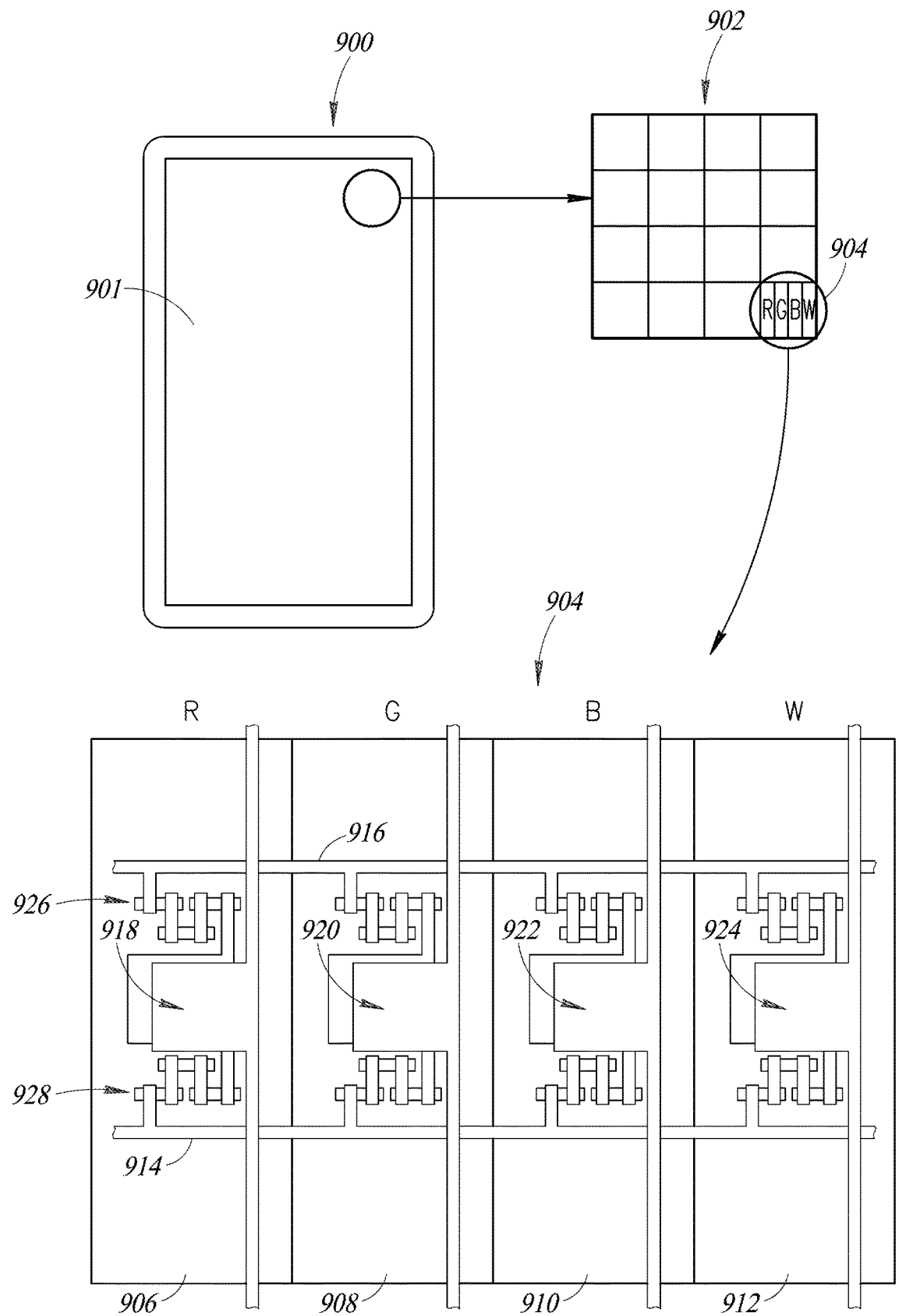
FIG. 9 includes a device with a screen having pixels formed in accordance with the present disclosure and enhanced views of the pixels.

FIG. 9 includes a device 900 with a screen 901 having an array 902 of pixels 904 formed in accordance with the present disclosure. The device may be any electronic device that includes a display, such as a television, a computer, a mobile phone, a tablet, or other device that includes pixels, such as the display in FIG. 7.

Each pixel 904 includes a red sub-pixel 906, a green sub-pixel 908, and a blue sub-pixel 910. Some embodiments will include a white sub-pixel 912. The sub-pixels are illustrated as having a vertical alignment configuration; however, any configuration is envisioned such that the sub-pixel is formed using multiple AMNR devices having at least one active area. The illustrated configuration includes two AMNR devices in each color where each AMNR device includes six active areas. Select lines 914 and 916 are shared across adjacent pixels and sub-pixels. The top electrode or second electrodes 918, 920, 922, 924 are coupled in columns to other adjacent pixels.

A vertical alignment (VA) pixel 906, 908, 910, 912 according to an embodiment of the present disclosure includes a first AMNR device 926 with six active areas and a second AMNR device 928 with six active areas. In other embodiments, the first AMNR device may have a different number of active areas as compared to the second AMNR device. The pixel can be formed with only two active areas per AMNR device. For example, if only two of the first interconnects are formed, the pixel would include the interconnects where extensions of the electrode would overlap the interconnects.

First interconnects are formed on a first glass layer. These first interconnects are amorphous metal thin films, which is a very planar, smooth material that simplifies the manufacturing process. Next, a tunneling insulator is formed on the first interconnects.

Second interconnects are formed on the tunneling insulator. Additional signals lines may be formed at the same time as the second interconnects. In addition, a first electrode may also be formed at the same time as the second interconnects. A liquid crystal layer or other display material layer is formed on the first electrode and the second interconnects.

A second electrode is formed on a second glass layer. The first and second electrodes are staggered in this embodiment; however the electrodes may be aligned with each other such that from a top view, the second electrode would obscure at least a central portion of the first electrode. In this embodiment, the first and second electrodes are generally square in shape; however other shapes are envisioned. These electrodes may also be comb fingered.

Said differently, the pixel may include the following: a first glass layer (substrate), a first and second amorphous metal thin film interconnect (interconnects) on the first glass layer, a first electrode (electrode) on the first glass layer, the first electrode being coupled between the first and second amorphous metal thin film interconnects, a second electrode (electrode 918), and a second glass layer, the second electrode on the second glass layer. As the demands of the pixel change, the design may change such that various combinations of interconnects and numbers of active areas can be achieved by combining different numbers of interconnects.

A process to build such a pixel with a vertical alignment and two active areas per AMNR device is a simple process, where no semiconductors are needed. The process to build the pixel, when the pixel is used in a display, is referred to as building a backplane. This backplane includes depositing and patterning the amorphous metal thin film interconnects on the first glass layer. Next, a tunneling insulator is deposited. Next, the first electrode is deposited and patterned. The second electrode is formed on the second glass layer by depositing and patterning. The second glass layer can be color filter glass. This second electrode may be indium tin oxide.

Select lines for the pixel may be formed at the same time as the first electrode. In an alternative embodiment, the select lines are formed first and then the first electrode is formed and coupled to the select lines. The select lines of FIG. 9 are lines 916 and 914 and may include the second interconnects. The select lines may be coupled to the first electrode through vias, which will be explained in more detail below.

If the second electrode is a non-transparent conductor, four mask steps are used in the process to form the pixel with two AMNR devices each having two active areas. The pixel window material must be formed from a transparent conducting oxide. The process includes depositing and patterning an amorphous metal thin film to form a first and a second interconnect that are spaced by a distance. This is the first mask step. The process includes forming a tunnel insulator and then depositing and patterning select lines above and overlapping the first and second interconnects. This is the second mask step. An insulator is formed over the select lines. Vias are formed through the insulator to provide access to ones of the select lines. The first electrode is then formed by depositing and patterning a conductive material and is coupled to the ones of the select lines through the vias. This is the third mask step. The second electrode is formed on the second glass layer using a conducting oxide. This is the fourth mask step. A liquid crystal layer is positioned between the first and the second electrode. Alternatively, a two-tone mask may be used to reduce a number of mask steps. This two-tone mask may be used when forming the select lines and the first electrode.

The AMNR devices can be fully formed after only two masking steps. When formed with the AMTFTs either in the pixels or as the control circuitry, there may be more than two masking steps as other layers will be incorporated for the other amorphous circuitry.

These amorphous metal thin film materials are very smooth, so they are excellent materials to start a manufacturing process with, as subsequent steps have a consistent surface to build on. These amorphous metal thin films are often the first layer formed; however, other configurations are envisioned, as described further in this disclosure.

A total height of the AMNR device from a top surface of the substrate to a top surface of the second level of interconnects is around 200 nanometers. These are very thin, high performing devices. The total height of an AMTFT may be in the range of 250 nanometers and 400 nanometers.

An AMNR device with only two active areas may be able to achieve a threshold voltage of around 5 volts, where a device with twelve active areas may be able to achieve at threshold voltage of around 30 volts where each device has a similar or identical thickness of the tunneling insulator.

The threshold voltage relationship between two AMNR devices with different numbers of active areas is:

$$V_{ThresholdAMNR-X\ \#2} = V_{ThresholdAMNR-X\ \#1} * (n_{AMNR-X\ \#2} / n_{AMNR-X\ \#1})$$

where AMNR-X #1 is the first AMNR device and AMNR-X #2 is the second AMNR device and n is the number of active areas.

The capacitance relationship between two AMNR devices with different numbers of active areas is:

$$Capacitance_{AMNR-X\ \#2} = Capacitance_{AMNR-X\ \#1} * (n_{AMNR-X\ \#1} / n_{AMNR-X\ \#2})$$

where AMNR-X #1 is the first AMNR device and AMNR-X #2 is the second AMNR device and n is the number of active areas.

Figure 10:
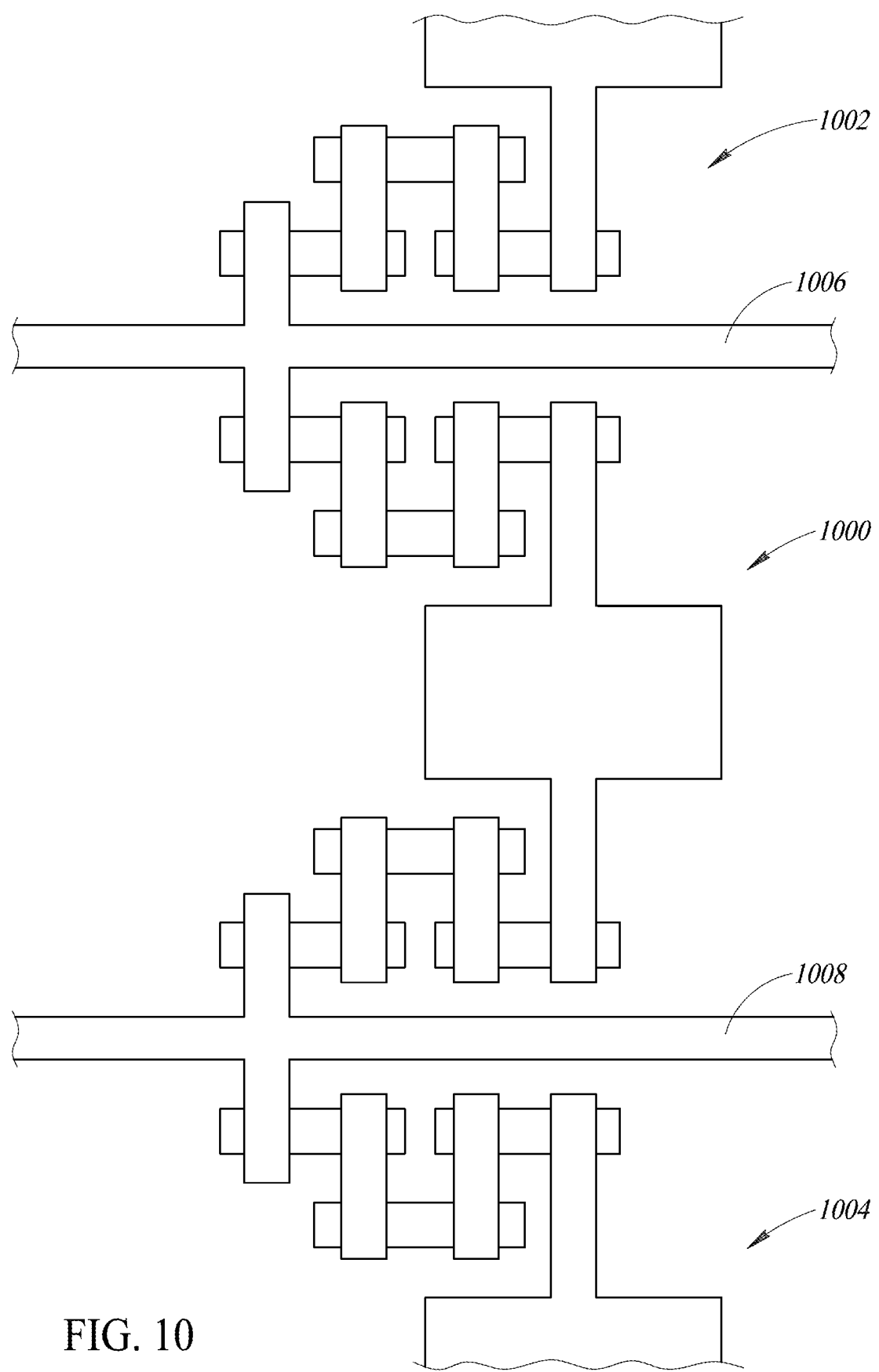
FIG. 10 is a top down view of a shared select line layout of an embodiment of the present disclosure.

FIG. 10 is a top down view of a plurality of sub-pixels that have a shared select line layout according to an embodiment of the present disclosure. A first sub-pixel 1000 is positioned between a second and a third sub-pixel 1002, 1004. Each sub-pixel has two select lines. The first sub-pixel 1000 has a first select line 1006 shared with the second sub-pixel 1002 and a second select line 1008 shared with the third sub-pixel 1004. These pixels can be incorporated with AMTFT circuitry on a display or other electronic device developed for high performance on non-silicon based substrates.

Figure 11:
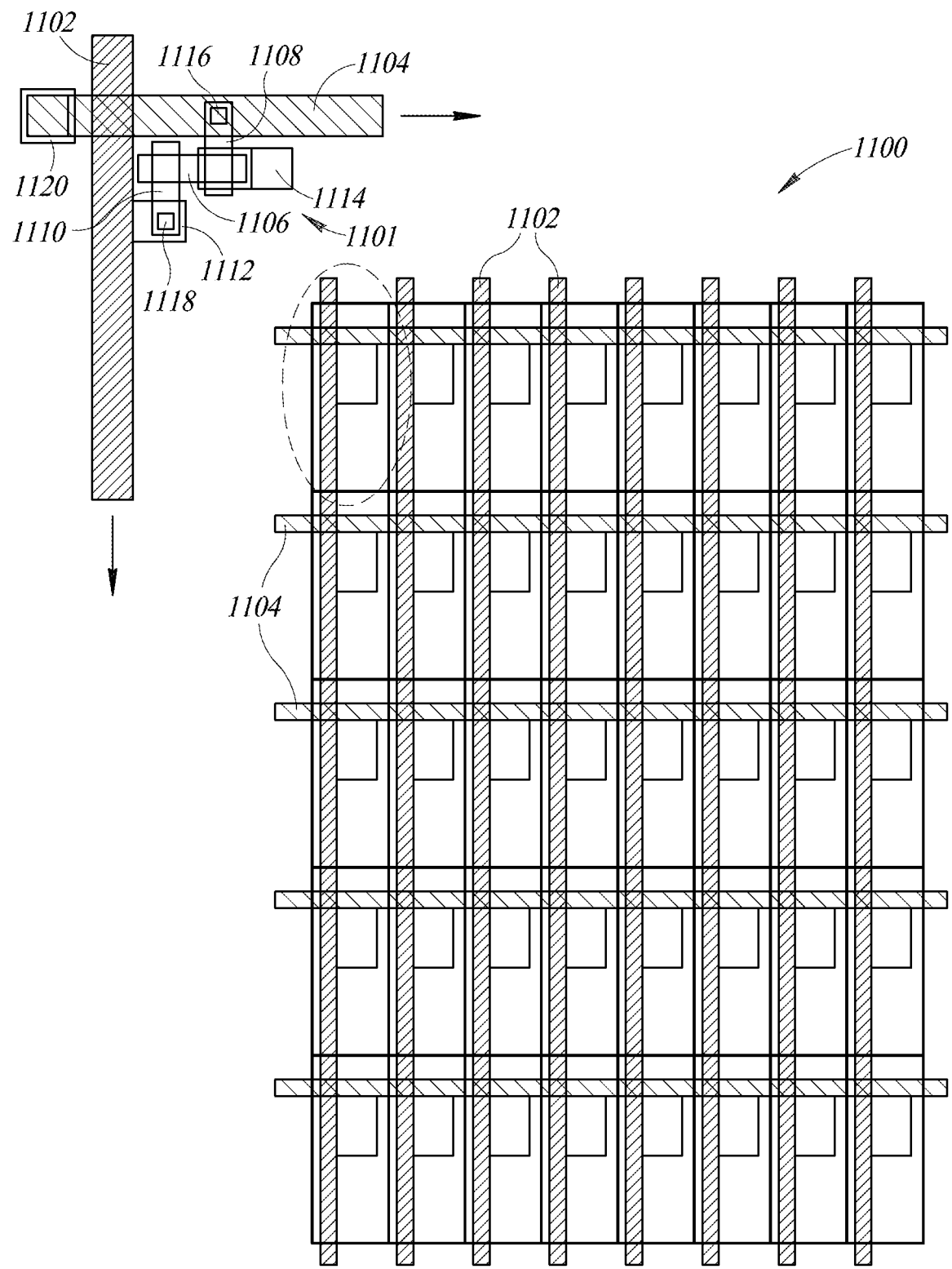
FIG. 11 is a transistor structure in an array for a display.

FIG. 11 is an illustrative array of transistor structures that may be used in a display, such as in the display area shown in FIG. 7. The array can be incorporated into a display or may be integrated with sensors, such as in an x-ray detector. The array 1100 includes a plurality of rows 1104 and a plurality of columns 1102. Each row can conduct a base signal to AMHET 1101 of the array. Each column can conduct emitter signals to the AMHET 1101. The AMHET 1101 includes an amorphous metal layer 1106. An emitter electrode 1110 overlaps the amorphous metal layer 1106 and couples to the column 1102. A base electrode 1108 overlaps the amorphous metal layer 1106 and couples to the row 1104. A collector electrode and contact 1114 overlap the amorphous metal layer 1106 and the base electrode 1108. The collector electrode 1114 is coupled to other pixel or cell control elements. The collector electrode 1114 may be coupled to a capacitor or other transistor. In various embodiments, a capacitor includes one or more amorphous metal layers. In some such embodiments, an amorphous metal in the capacitor is a same amorphous metal used in an AMTFT.

This AMHET transistor 1101 could be operated as a matrix switch in common base, common emitter, or common collector modes. This particular illustration is a common emitter configuration. Such a matrix switch allows for a single element to be controlled.

A plurality of AMHET transistors 1101 can be incorporated into a variety of active matrix display technologies, such as liquid crystal displays, organic light emitting diode displays, electrophoretic, electroluminescent, etc. Each specific active matrix application will have additional circuit elements to form the display. Some of the elements, such as resistors, capacitors, diodes, other transistors, or other electronic components can be formed in the same processing steps as the AMHET or in subsequent processing.

In embodiments, an AMHET structure includes an amorphous metal interconnect on the support substrate and a first tunneling insulator on the amorphous metal interconnect. A first electrode and a second electrode are on the first tunneling insulator. The first and second electrodes overlap the amorphous metal interconnect. A third electrode overlaps the second electrode and is separated from the second electrode by a second insulator. Illustrative AMHET structures are described and shown, for example, in WO 2018/009901, which is incorporated by reference herein for its teachings regarding the same.

This structure includes a first terminal coupled to the first electrode. A second terminal is coupled to the second electrode. A third terminal may be included to couple the third electrode to another electronic device. The first and second terminals can be formed at the same time as the third electrode. Alternatively, the first and second terminals are formed in a subsequent processing step as forming the third electrode.

This AMHET structure operates like a transistor by adjusting an electric field applied to the first electrode, the second electrode, and the third electrode. The first electrode can be an emitter electrode, the second electrode can be a base electrode, and the third electrode can be a collector electrode. The transistor structure can be operated in common-emitter mode, common-base mode, or common collector mode.

Electrons tunnel from the first electrode, the emitter electrode, through the first tunneling insulator to the amorphous metal interconnect in response to an applied voltage through the first terminal. The electrons travel through the amorphous metal interconnect and the first tunneling insulator to the second electrode, the base electrode. These electrons are considered "hot" when the tunneling has finished because their energy is above the Fermi energy of the second electrode, the base electrode. These principles apply to all embodiments described in this disclosure.

Unlike typical transistor structures, the amorphous metal transistor structures can be operated in a reverse mode, such that the electrons move from the third electrode to the first electrode via the second electrode and the amorphous metal interconnect. In this reverse mode, the transistor structure functions like a tunneling diode with an adjustable threshold voltage and asymmetry. The adjustable threshold voltage and asymmetry are achieved by modulating the electric field applied to the second electrode in combination with the electric field applied from the first electrode 108 and the third electrode.

In further embodiments, an AMHET structure includes an amorphous metal layer formed on a support substrate that is non-conductive or includes an insulator on the substrate to isolate the substrate from the amorphous metal layer. A tunneling oxide layer is formed on the amorphous metal layer. A first electrode and a second electrode are formed on and are coplanar on the tunneling oxide, with portions of the first and second electrodes overlapping the amorphous metal layer.

A dielectric layer is formed on the first and second electrodes. A third electrode and a fourth electrode are formed on the dielectric layer. Portions of the third electrode and the fourth electrode overlap and are aligned with the amorphous metal layer and the first and second electrodes, respectively. The third and fourth electrodes are formed from a same material at a same time. Contacts can also be formed at the same time as the third and fourth electrodes. The contact couples to the second electrode through the dielectric layer and the contact couples to the first electrode through the dielectric layer.

A first area of overlap of the amorphous metal layer, the first electrode, and the third electrode forms is where electrons can pass to and from the first electrode and the amorphous metal layer. There is a second active area that corresponds to the overlap of the amorphous metal layer, the second electrode, and the fourth electrode. This second active area is where electrons can pass to and from the second electrode and the amorphous metal layer.

The first electrode and the second electrodes correspond to an emitter and a base, respectively. The third and fourth electrodes are collector electrodes. These two collector electrodes form two transistors with a shared base-emitter structure. This two transistor structure can be formed by the same method as the transistor structure, which the difference being simply leaving more of the conductive layer when forming the third electrode.

In another embodiment, an AMHET transistor structure includes an amorphous metal film formed on a substrate. A tunneling insulator is on the amorphous metal film.

In one area, the tunneling insulator is thinned or otherwise patterned to have a different thickness than other areas of the tunneling insulator. The operational properties of the transistor structure are tuned by adjusting the thickness of the tunneling insulator. If the tunneling insulator has been selectively thinned in one active area there may not be symmetrical conduction through the emitter-base structure due to the different thicknesses. This is acceptable in some end use cases.

A first electrode is formed to overlap the amorphous metal film and is separated from the amorphous metal film by the tunneling insulator having a first thickness. A second electrode, which may be the same material as the first electrode and formed in a same processing step or may be a different material formed at a different time, is formed to overlap the amorphous metal film. The second electrode is spaced from the first electrode and is generally in a parallel orientation with respect to the first electrode.

The second electrode is separated from the amorphous metal film by the tunneling insulator having a second thickness, which is less than the first thickness. The behavior of the electrons passing to and from the first electrode to the amorphous metal film will be different from the behavior of the electrons to and from the second electrode to the amorphous metal film as a result of the different thicknesses. For example, the patterned tunneling insulator can minimize parasitic capacitance that can form at the areas of overlap of the first and second electrodes with the amorphous metal film. As such, the tunneling insulator can be patterned in the area of overlap of any one of the electrodes as the manufacturing and end product may dictate.

An insulator is formed on the first and second electrodes. A third electrode is formed on the first and second electrodes. Formed at the same time as the third electrode, contacts are formed to couple to the second electrode and the first electrode, respectively.

In a further embodiment, an AMHET transistor structure has base and emitter electrodes of different dimensions. The transistor structure includes an amorphous metal interconnect on a planar substrate. The amorphous metal interconnect is rectangular from the top down perspective and has a longest dimension that extends in a first direction.

A tunneling insulator is on the interconnect. An emitter electrode is on the tunneling insulator. A base electrode is also on the tunneling insulator, spaced from the emitter electrode. Both the emitter and base electrodes are at least partially on top of and overlap the interconnect.

The base electrode includes at least a portion that is over and aligned with the interconnect that has a first dimension that is smaller than a second dimension of the emitter electrode. Having different dimensions changes the operational properties of the transistor giving the manufacturer the opportunity to tune the transistor structure. For example, a gain of the transistor structure can be increased by making the base electrode thinner. The base electrode and the emitter electrode may be the same material or may be different materials.

The base electrode maybe formed to have a first thickness and then thinned as shown, such that a first portion of the base electrode is the first thickness and a second portion of the base electrode is a second thickness that is less than the first thickness. Alternatively, the base electrode can be formed in a different processing step from the emitter electrode and formed to be thinner than the emitter electrode. Instead of removing portions of the base electrode once formed, the base electrode can be formed as a thinner layer than the emitter electrode.

A first dielectric layer is formed on the base and emitter electrodes. A collector electrode is formed on the first dielectric layer. A contact to the base electrode can be formed at the same time and from the same material as the collector electrode. An opening through the first dielectric layer is formed to allow contact to the base electrode. Another contact can be formed to the emitter electrode in a similar manner.

A second dielectric layer may be formed on the collector electrode and contacts. In some embodiments, a contact is formed through the second dielectric layer to couple the collector terminal to another device.

In further embodiments, an AMHET transistor structure includes an amorphous metal layer formed on a substrate. A tunneling oxide layer is formed on the amorphous metal layer. A barrier layer is formed on the tunneling oxide layer. The barrier layer can be an inorganic material, such as a metal oxide or an organic material, such as a polymer, or any suitable material. The barrier layer can minimize parasitic capacitance that can occur due to the amorphous metal and electrode overlaps.

A first opening is formed in the barrier layer. A first electrode is formed in the first opening. The first electrode overlaps the amorphous metal layer. A second opening is formed in the barrier layer overlapping a portion of the amorphous metal layer. A second electrode is formed to overlap the amorphous metal layer and a portion of the second electrode is in the second opening.

A dielectric layer is formed on the first and second electrodes. A third electrode is formed on the dielectric layer. In embodiments, none of the layers are planarized. In other embodiments, each layer or some of the layers are planarized.

A fourth electrode and a fifth electrode couple to the first electrode and the second electrode, respectively. The fourth and fifth electrodes can be formed at the same time, from the same material as the third electrode.

The first and second electrodes of this embodiment or any embodiment of the present disclosure may be formed of ultra-thin, 2-D conductors, such as graphene, $MoS_2$, $W_2$, $Ti_3C_2$, GaN, BN, $Ca_2N$, or other suitable materials. In some embodiments, the first electrode is an atomically thin layer of conductive material and the second electrode is a significantly thicker layer of conductive material. The conductive materials for these layers may be different types of conductors.

In an alternative embodiment, an AMHET transistor structure has an amorphous metal layer formed in a recess of a substrate. A first surface of the amorphous metal layer is coplanar with a first surface of the substrate.

A tunneling oxide layer is formed on the amorphous metal layer and the first surface of the substrate. First and second electrodes are formed on the tunneling oxide layer. The first electrode overlaps a first portion of the amorphous metal layer and the second electrode overlaps a second portion of the amorphous metal layer.

A first dielectric layer is on the first and second electrodes. A third electrode is formed on a planar surface of the first dielectric layer. A second dielectric layer is on the third electrode.

In yet another embodiment, an AMHET transistor structure includes an amorphous metal layer on a planar surface of a substrate. A tunneling oxide layer is on the amorphous metal layer. Sides of the amorphous metal layer and sides of the tunneling oxide layer are coplanar. This can be achieved by forming an amorphous layer, forming a tunneling oxide layer, and then etching both layers at the same time.

First and second electrodes are formed on the tunneling oxide layer. A dielectric layer is formed on the first and second electrodes. A third electrode is formed on the dielectric layer.

Advantageously, processing steps used to form an AMTFT of the present disclosure can be used to also form an AMNR and/or an AMHET adjacent to the AMTFT. For example, as shown in FIG. 12A and FIG. 12B, the AMTFT 1200 (shown in FIG. 1, and described above) is formed adjacent to an AMNR 1220 on support substrate 1202. As would be understood by one of ordinary skill, the AMNR shown in FIGS. 12A-17 could be replaced with an AMHET, or any other suitable structure, and a similar processing advantage could be achieved.

In embodiments, amorphous metal gate electrode 1204 and amorphous metal interconnect 1224 are deposited and formed in the same processing steps, which may include forming a first amorphous metal layer on the substrate 1202, patterning the first amorphous metal layer, and removing portions of the first amorphous metal layer.

The AMTFT 1200 may be a transistor in the section circuitry with the AMNR 1220 being a pixel in a display area, such that a distance between the AMTFT and the AMNR is relatively large. In such an embodiment, the AMTFT and the AMNR may not be directly coupled together. In other embodiments, the AMTFT and the AMNR are part of a single pixel such that they may be directly coupled to each other.

The first tunneling insulator 1206 is deposited on the amorphous metal gate electrode 1204 and amorphous metal interconnect 1224. This first tunneling insulator can be a conformal layer, which will be formed without any masks. Source/drain electrodes 1208, 1210, as well as first and second electrodes 1228, 1230, are then deposited on the first tunneling insulator 1206 as described according to other embodiments in this disclosure. The source/drain electrodes 1208, 1210 and first and second electrodes 1228, 1230 can be deposited as a single layer, such as an amorphous metal layer, patterned, then, etched to form the appropriate shape. For example, the source/drain electrodes 1208, 1210 have ends 1211, 1213 that extend away from the gate 1204 to be coupled to other devices or to ends 1215, 1217 of the first and second electrodes 1228, 1230.

The channel conductor 1212 is then deposited overlapping the source/drain electrodes 1208, 1210. Further, the second insulator 1214 is optionally deposited and formed on the channel conductor 1212, source/drain electrodes 1208, 1210, and first and second electrodes 1228, 1230. The channel conductor may be formed as a layer, such as a layer of amorphous semiconductor, patterned, then etched. This process can be a three mask process. This AMTFT structure allows the AMNR to be fully formed before the semiconducting layer required for the AMTFT channel is deposited. This reduces AMNR tunneling insulator damage during channel deposition and formation.

Figure 13A:
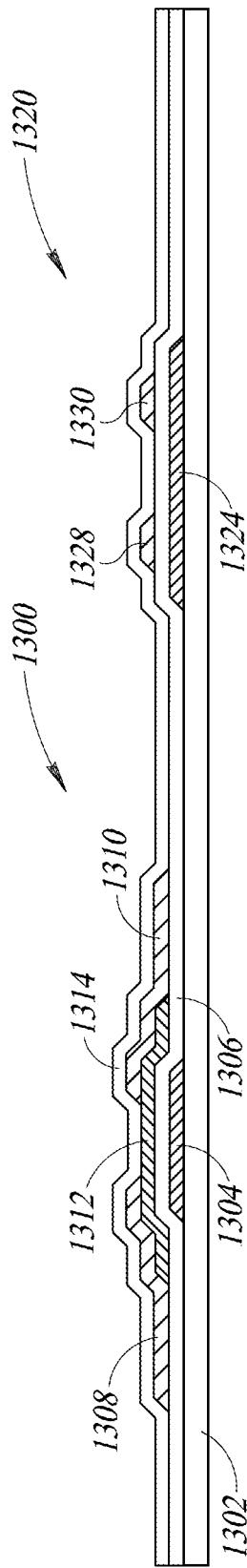
FIG. 13A is a cross-sectional view of an AMTFT formed adjacent to an AMNR according to an embodiment of the present disclosure.
Figure 13B:
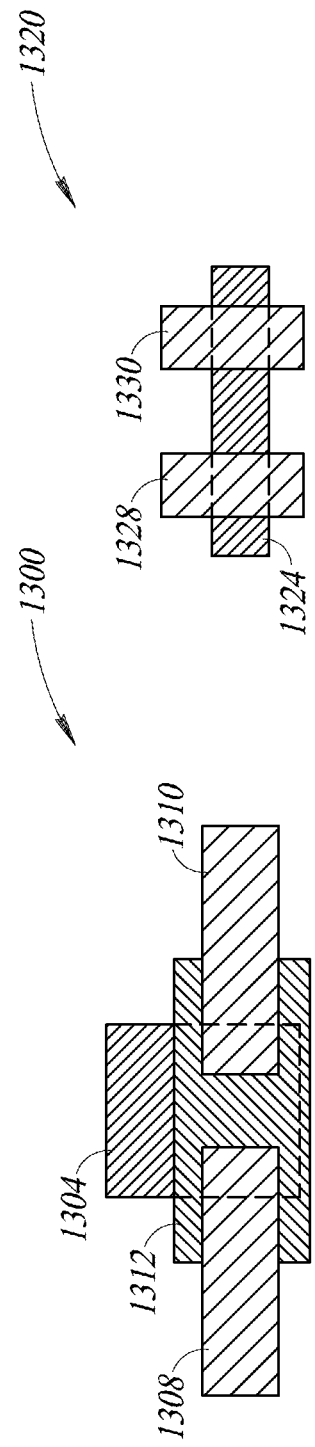
FIG. 13B is a top-down view of features of the AMTFT and AMNR of FIG. 13A.

Similarly, processing steps used to form other AMTFTs of the present disclosure can be used to also form such an AMNR adjacent to the AMTFT. For example, as shown in FIG. 13A, which is a cross-sectional view, and 13B, which is a top down view, the AMTFT 1300 (shown in FIG. 2 and as described above) is formed adjacent to an AMNR 1320 on support substrate 1302. In such embodiments, amorphous metal gate electrode 1304 and amorphous metal interconnect 1324 are deposited and formed in the same processing step(s). The first tunneling insulator 1306 is then deposited and formed on the amorphous metal gate electrode 1304 and amorphous metal interconnect 1324. The channel conductor 1312 is then deposited and formed on the first tunneling insulator 1306. The channel is formed before the AMNR is completed and is patterned and etched to overlap the metal gate electrode 1304.

Source/drain electrodes 1308, 1310, are then deposited and formed on the channel conductor 1312 and the first tunneling insulator 1306, and first and second electrodes 1328, 1330, are deposited and formed on the first tunneling insulator 1306 as described herein. The source/drain electrodes 1308, 1310 and the first and second electrodes 1328, 1330 can be formed at the same time, with the same material. There are some embodiments where these may be different materials formed in different processing steps, if beneficial to the end product. Further, the second insulator 1314 is optionally deposited and formed on the source/drain electrodes 1308, 1310, channel conductor 1312, and first and second electrodes 1328, 1330. Although not illustrated, the AMNR and AMTFT will be coupled to each other and other circuitry, which can be applied to the other embodiments described.

Figure 14A:
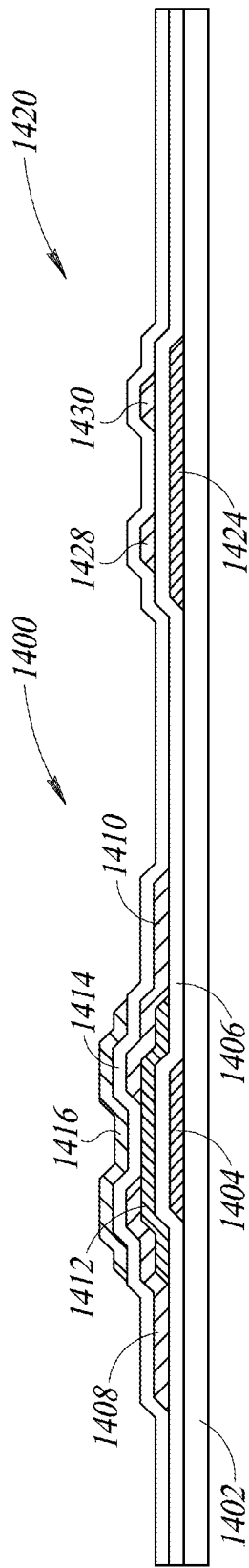
FIG. 14A is a cross-sectional view of an AMTFT formed adjacent to an AMNR according to an embodiment of the present disclosure.
Figure 14B:
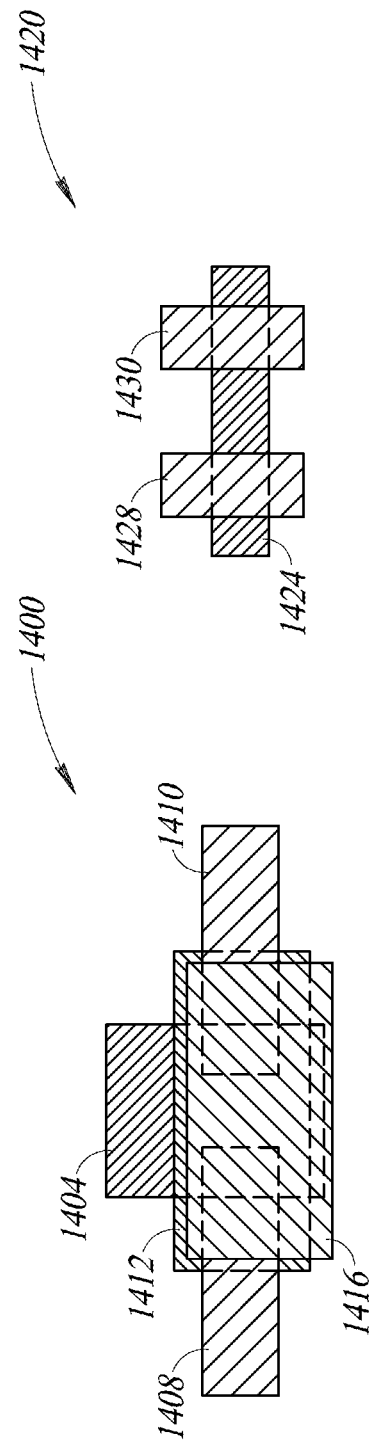
FIG. 14B is a top-down view of features of the AMTFT and AMNR of FIG. 14A.

In an additional example, as shown in FIG. 14A, which is a cross-sectional view, and 14B, which is a top down view, the AMTFT 1400 (shown in FIG. 3 and as described above) is formed adjacent to an AMNR 1420 on support substrate 1402. In such embodiments, amorphous metal gate electrode 1404 and amorphous metal interconnect 1424 are deposited and formed in the same processing step(s). The first tunneling insulator 1406 is then deposited and formed on the amorphous metal gate electrode 1404 and amorphous metal interconnect 1424. The channel conductor 1412 is then deposited and formed on the first tunneling insulator 1406. Source/drain electrodes 1408, 1410, are then deposited and formed on the channel conductor 1412 and the first tunneling insulator 1406, and first and second electrodes 1428, 1430, are deposited and formed on the first tunneling insulator 1406 as described herein. Further, the second insulator 1414 is optionally deposited and formed on the source/drain electrodes 1408, 1410, channel conductor 1412, and first and second electrodes 1428, 1430. The second gate electrode 1416 is then deposited and formed over second insulator 1414.

Figure 15A:
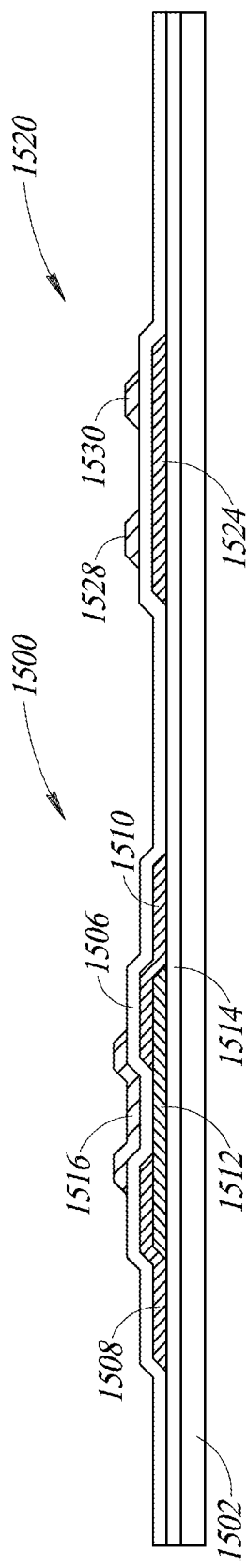
FIG. 15A is a cross-sectional view of an AMTFT formed adjacent to an AMNR according to an embodiment of the present disclosure.
Figure 15B:
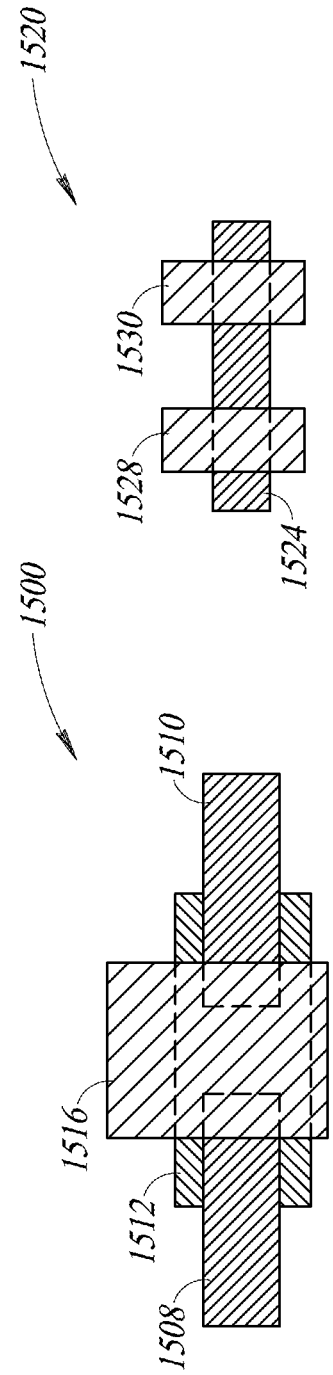
FIG. 15B is a top-down view of features of the AMTFT and AMNR of FIG. 15A.

In further embodiments, shown in FIG. 15A, which is a cross-sectional view, and 15B, which is a top down view, AMTFT 1500 (shown in FIG. 4A and FIG. 4B, and described above) and AMNR 1520 are formed adjacent to one another. A first insulator 1514 is deposited and formed on the support substrate 1502. Channel conductor 1512 is then deposited and formed on the first insulator 1514. Source/drain electrodes 1508, 1510 are deposited and formed of amorphous metal and overlap the channel conductor 1512. In the same step(s), amorphous metal interconnect 1524 is deposited and formed on first insulator 1514. A second tunneling insulator 1506 is then deposited and formed on source/drain electrodes 1508, 1510 and on amorphous metal interconnect 1524. Gate electrode 1516 and the first and second electrodes 1528, 1530 are then formed on the second tunneling insulator 1506 and may be formed in a same process step or steps. This AMTFT structure allows the AMNR to be fully formed after the semiconducting layer for the AMTFT channel conductor is deposited and formed. This reduces the potential for AMNR tunneling insulator damage during channel deposition and formation.

Figure 16A:
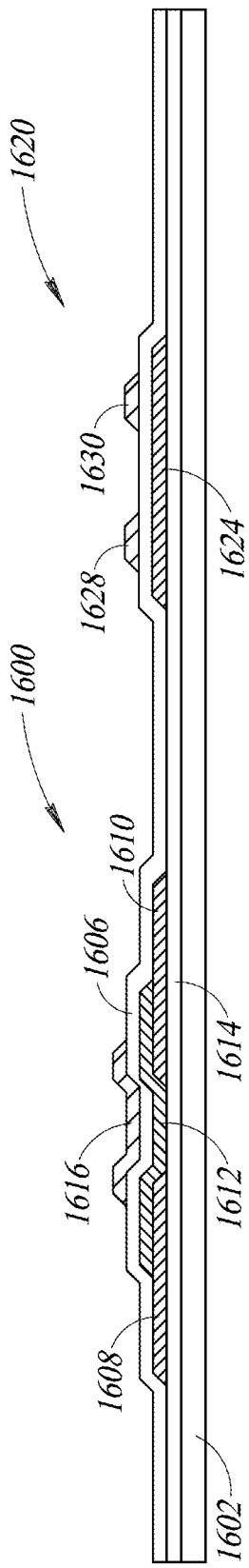
FIG. 16A is a cross-sectional view of an AMTFT formed adjacent to an AMNR according to an embodiment of the present disclosure.
Figure 16B:
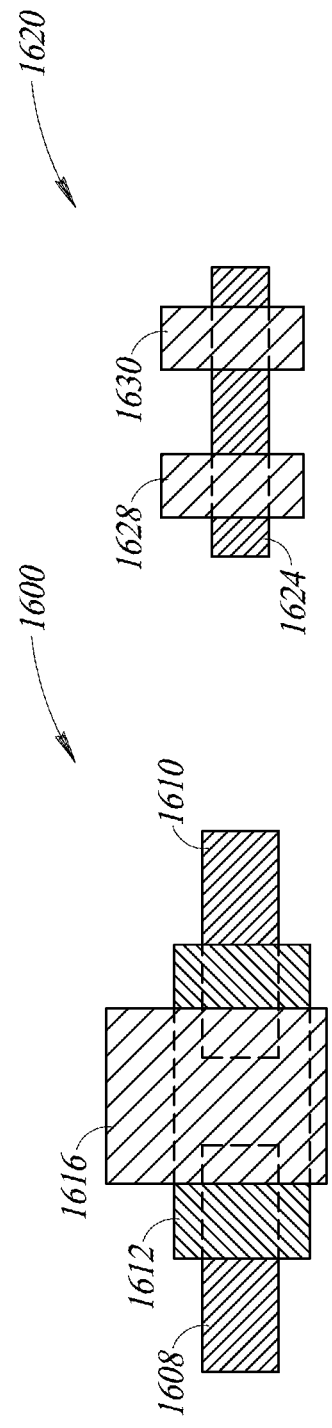
FIG. 16B is a top-down view of features of the AMTFT and AMNR of FIG. 16A.

In other embodiments, shown in FIG. 16A, which is a cross-sectional view, and 16B, which is a top down view, AMTFT 1600 (shown in FIG. 5A and FIG. 5B, and described above) and AMNR 1620 are formed adjacent to one another. A first insulator 1614 is deposited and formed on the support substrate 1602. Source/drain electrodes 1608, 1610 are deposited and formed of amorphous metal on the first insulator 1614. In the same step(s), amorphous metal interconnect 1624 is deposited and formed on first insulator 1614. Channel conductor 1612 is then deposited and formed overlapping source/drain electrodes 1608, 1610. A second tunneling insulator 1606 is then deposited and formed on source/drain electrodes 1608, 1610, channel conductor 1612, and on amorphous metal interconnect 1624. Gate electrode 1616 and the first and second electrodes 1628,

1630 are then formed on the second tunneling insulator 1606 in the same processing step(s).

In other embodiments, shown in FIG. 17A, which is a cross-sectional view, and 17B, which is a top down view, AMTFT 1700 (shown in FIG. 6A and FIG. 6B, and described above) and AMNR 1720 are formed adjacent to one another. A first amorphous metal gate electrode 1704 and amorphous metal interconnect 1724 are deposited and formed on support substrate 1702. A first tunneling insulator 1706 is then formed on the amorphous metal gate electrode 1704 and amorphous metal interconnect 1724. A channel conductor is then formed on the first tunneling insulator 1706. A second tunneling insulator 1718 is deposited and formed on channel conductor 1712. A second gate electrode 1716 is deposited over the second tunneling insulator 1718. A third insulator 1714 is deposited over the second gate electrode 1716 and the first tunneling insulator 1706. In embodiments, the third insulator layer 1714 is deposited as a continuous layer, and portions are then removed, such that the channel conductor 1712 and first tunneling insulator 1706 are exposed in one or more locations. In other embodiments, the third insulator layer 1714 is deposited as a discontinuous layer, such that the channel conductor 1712 and first tunneling insulator 1706 are exposed in one or more locations. Source/drain electrodes 1708, 1710 and first and second electrodes 1728, 1730 are formed over third insulator layer 1714 in the locations in which the channel conductor 1712 and first tunneling insulator 1706 are exposed.

The embodiment in FIGS. 17A and 17B is a top gate, self-aligned AMTFT with two gates. The first gate 1704 is a bottom gate, while the second gate 1716 is the last component formed.

Figure 18A:
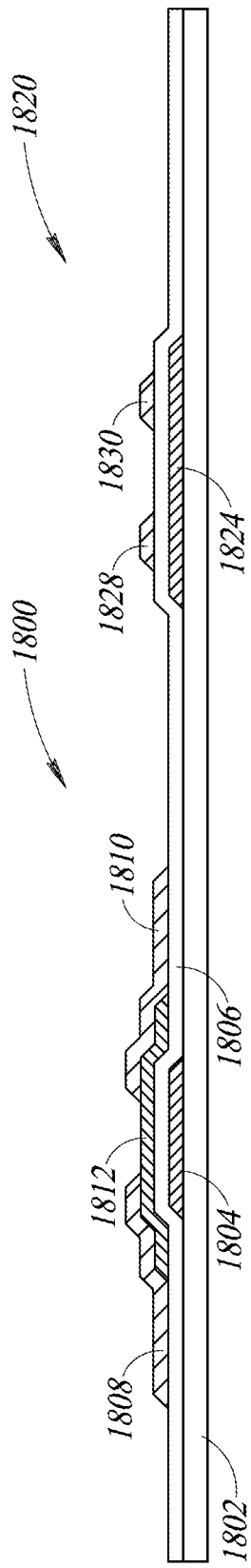
FIG. 18A is a cross-sectional view of an AMTFT formed adjacent to an AMHET according to an embodiment of the present disclosure.
Figure 18B:
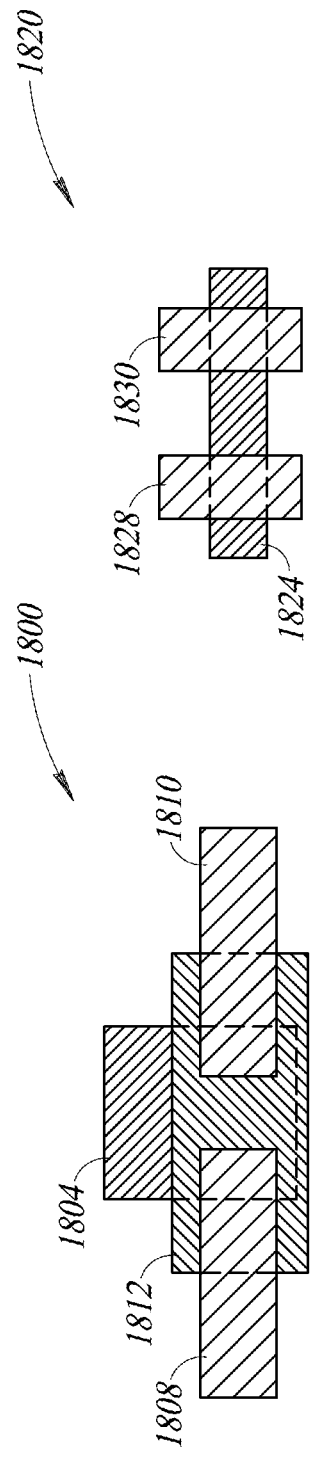
FIG. 18B is a top-down view of features of the AMTFT and AMNR of FIG. 18A.

A specific embodiment of an AMTFT and an adjacent AMNR is shown in FIG. 18A, which is a cross-sectional view of AMTFT structure 1800 and AMNR structure 1820, and FIG. 18B, which is a top down view of the same. The AMTFT 1800 and AMNR 1820 are formed on a support substrate 1802. The AMTFT 1800 includes an amorphous metal gate electrode 1804 on the support substrate 1802 and the AMNR 1820 includes an amorphous metal interconnect 1824. In embodiments, amorphous metal gate electrode 1804 and amorphous metal interconnect 1824 are deposited and formed in the same processing step(s). In some embodiments, the amorphous metal gate electrode 1804 and amorphous metal interconnect 1824 are formed of $TiA_3$. In some such embodiments, the amorphous metal gate electrode 1804 and amorphous metal interconnect 1824 are approximately 60 nanometers (nm) thick.

The first tunneling insulator 1806 is then deposited and formed on the amorphous metal gate electrode 1804 and amorphous metal interconnect 1824. In particular embodiments, the first tunneling insulator 1806 includes $Al_2O_3$. In some such embodiments, the first tunneling insulator 1806 is approximately 15 nm thick.

The channel conductor 1812 is then deposited and formed on the first tunneling insulator 1806. In some embodiments, the channel conductor 1812 is formed of InGaZnO. In some such embodiments, the channel conductor 1812 is approximately 20 nm thick.

Source/drain electrodes 1808, 1810, are then deposited and formed on the channel conductor 1812 and the first tunneling insulator 1806, and first and second electrodes 1828, 1830, are deposited and formed on the first tunneling insulator 1806 as described herein. In particular embodiments, the source electrode 1808, drain electrode 1810, first electrode 1828, and second electrode 1830 are made of aluminum and molybdenum. In some such embodiments, each electrode includes a layer of aluminum that is approximately 300 nm thick and a layer of molybdenum that is approximately 80 nm thick.

Source/drain electrodes 1808, 1810 are arranged, in part, on the channel conductor 1812 and, in part, on a surface of the first tunneling insulator 1806. The source and drain electrodes 1808, 1810 overlap the amorphous metal gate electrode 1804. In specific embodiments, the source and drain electrodes 1808, 1810 overlap the amorphous metal gate electrode 1804 by approximately 1 µm.

In some embodiments, the source and drain electrodes 1808, 1810 are approximately 400 micrometers (µm) wide. In particular embodiments, the source and drain electrodes 1808, 1810 are separated by approximately 100 µm.

The first and second electrodes 1828, 1830 are arranged over the amorphous metal interconnect 1824. In particular embodiments, the first and second electrodes 1828, 1830 are approximately 5 µm wide. In some such embodiments, the amorphous metal interconnect 1824 is also approximately 5 µm wide.

Figure 18C:
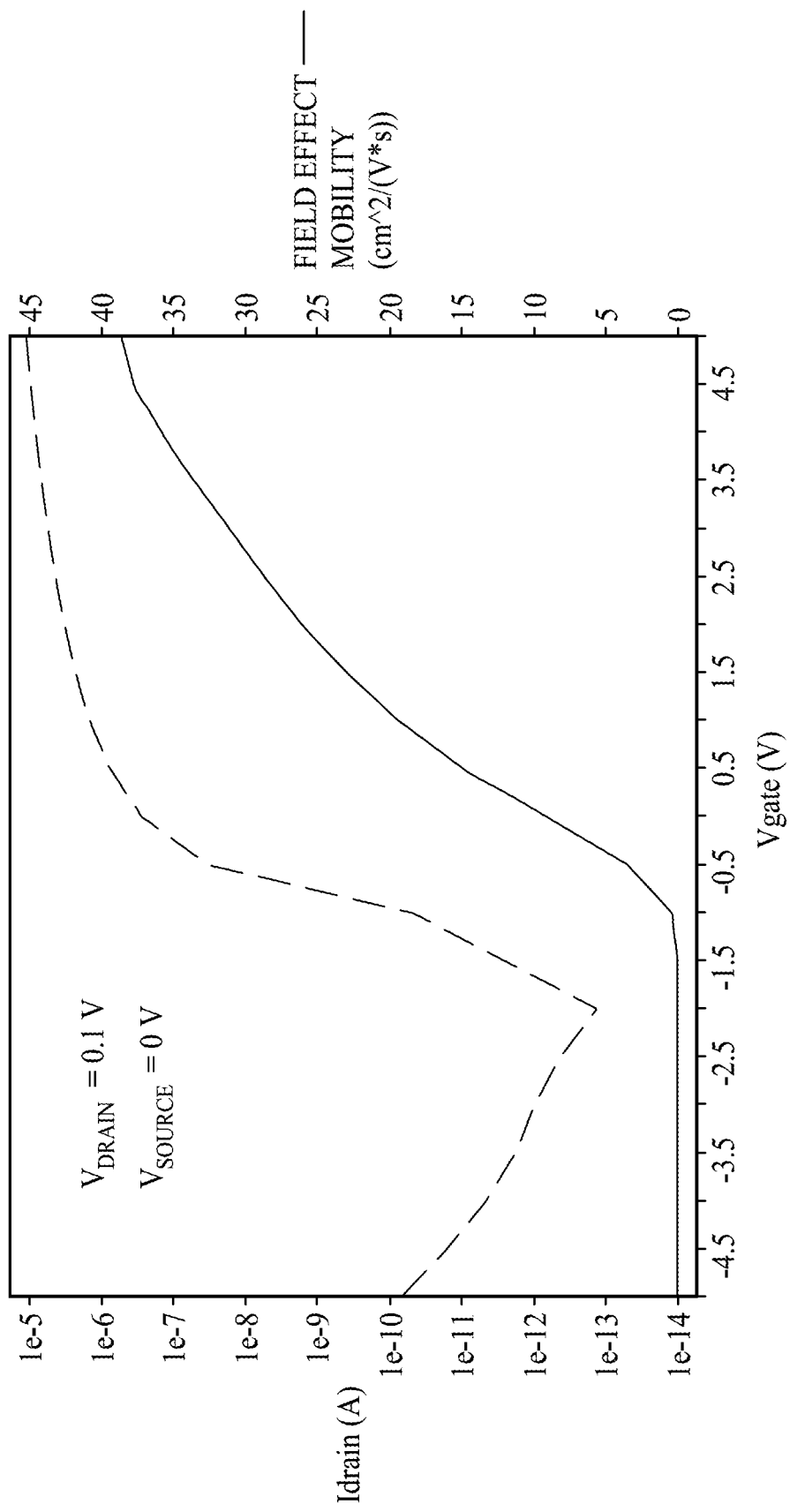
FIG. 18C and FIG. 18D show performance data of the AMTFT and AMNR of FIGS. 18A and 18B.
Figure 18D:
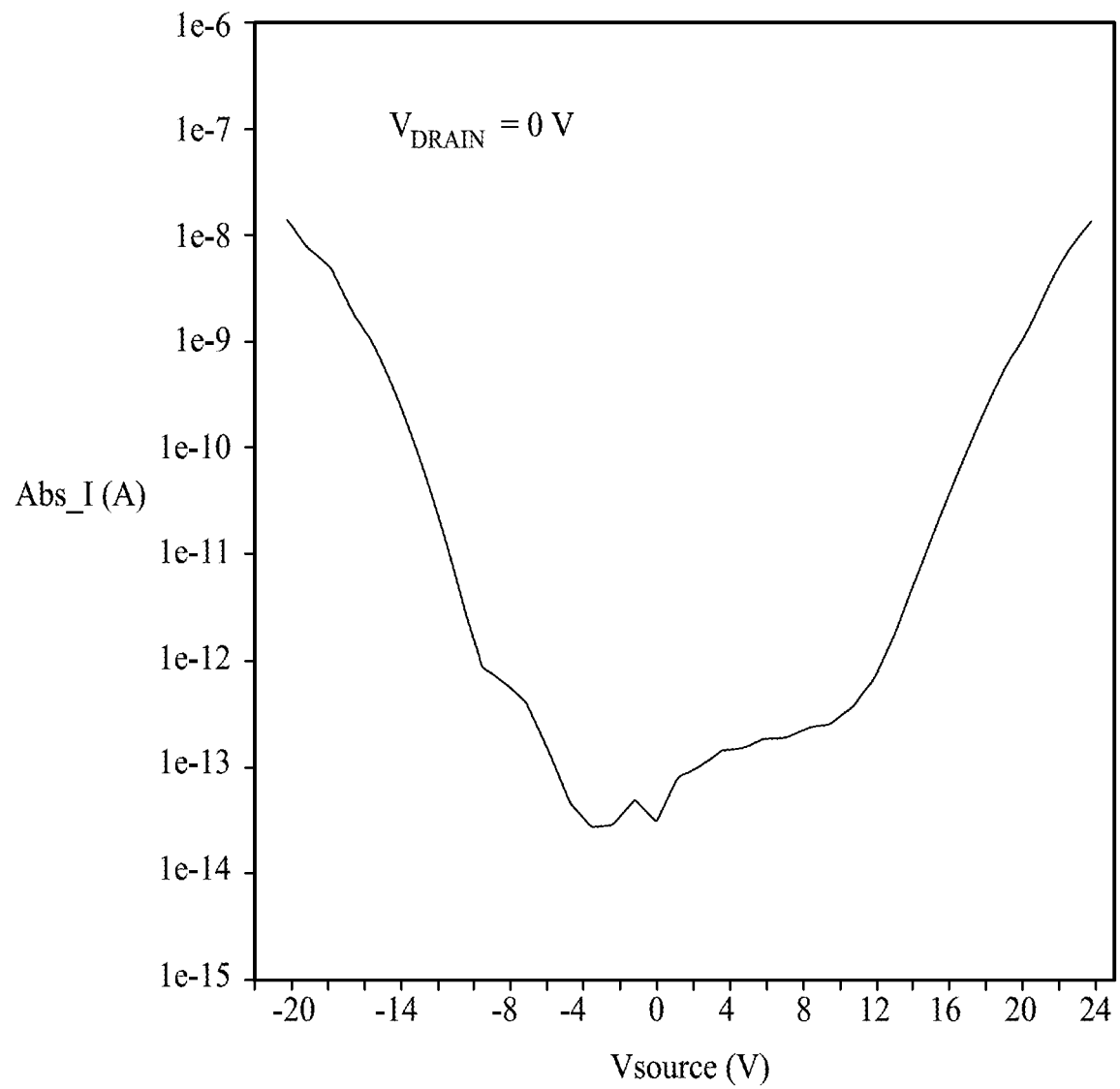

The AMTFT and AMNR of FIG. 18A and FIG. 18B were made and tested. The resultant transfer curve and plot of electron mobility are shown in FIG. 18C. The current-voltage curve of the AMNR is shown in FIG. 18D. The AMTFT is a bottom gate, top contact structure.

Figure 19A:
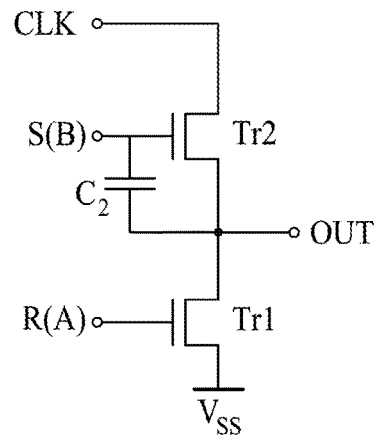
FIG. 19A shows an example of a circuit diagram of a reset/set flip-flop.
Figure 19B:
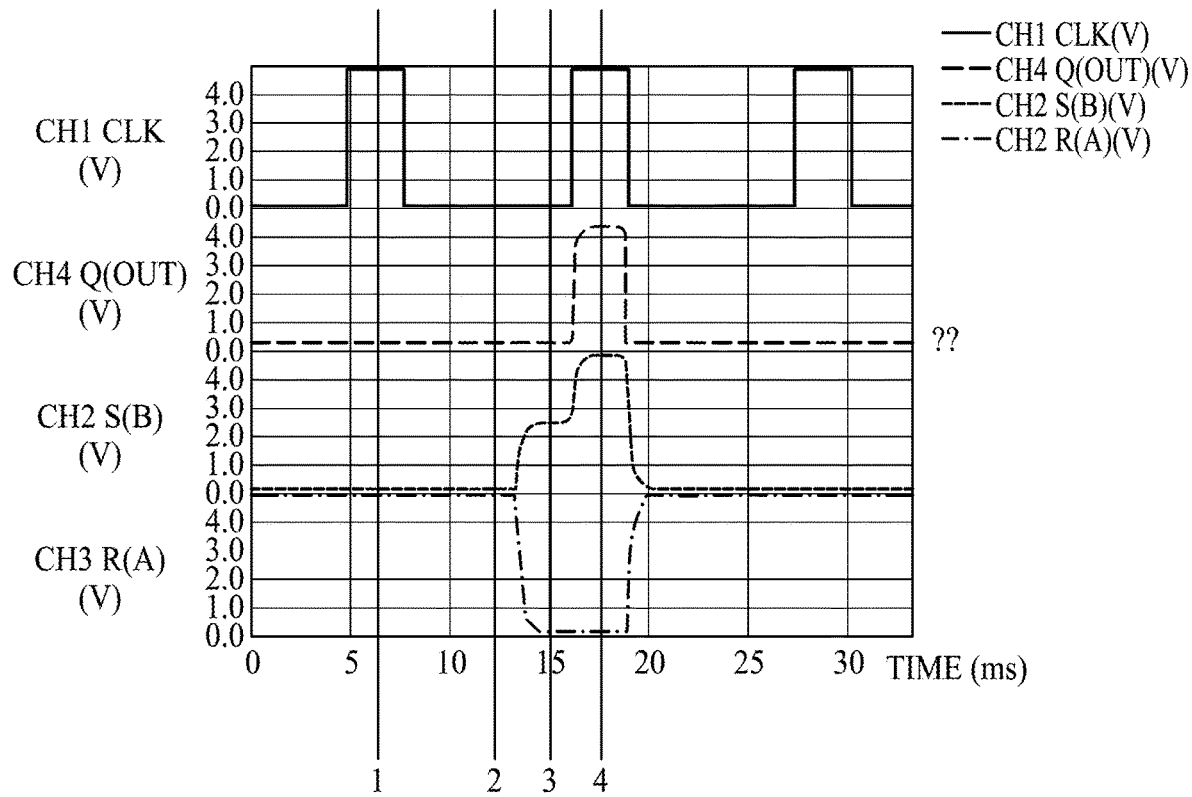
FIG. 19B shows measurements of each node of a reset/set flip flop including an AMTFT.
Figures 19C, 20A:
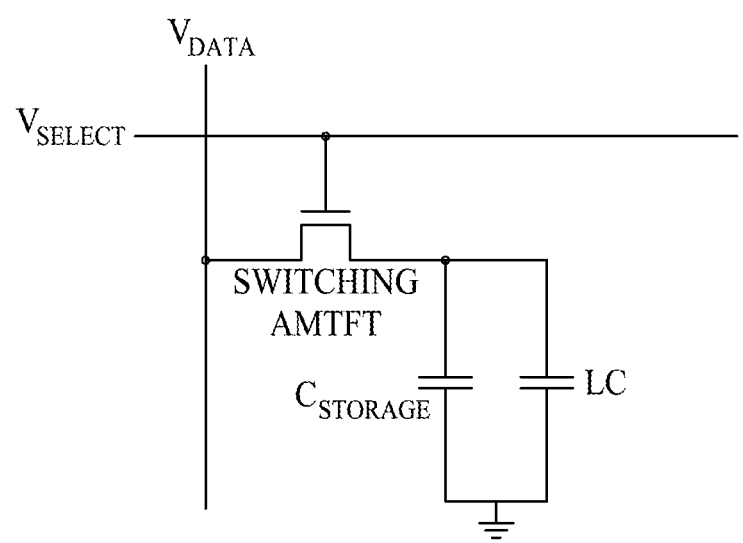
FIG. 19C shows a truth table.
FIG. 20A shows a circuit diagram for an exemplary AMLCD or EPD circuit.

In various embodiments, the AMTFT structures described herein are used in a circuit structure. Accordingly, embodiments of the present disclosure include a circuit including an AMTFT. For example, an AMTFT may be used in a reset/set flip-flop. An Example of a circuit diagram of a reset/set flip-flop is shown in FIG. 19A. Timing diagrams of a reset/set flip flop including an AMTFT are shown in FIG. 19B, and a truth table is shown in FIG. 19C. The inputs and outputs for the numbered lines in FIG. 19B correspond to the Phase column in FIG. 19C.

In another embodiment, one or more AMTFTs are used in a display. In some such embodiments, the AMTFT is used as a switching TFT in an Active-matrix liquid-crystal display (AMLCD) or electrophoretic display (EPD) circuit. FIG. 20A shows a circuit diagram for an exemplary AMLCD or EPD circuit. FIG. 20B shows a top down view of an illustrative matrix of AMLCD or EPD circuits. FIG. 20C shows a single pixel circuit of the array, as indicated by the rectangle in FIG. 20B. In this embodiment, the AMTFT structure 2000 includes a metal gate electrode 2004 and a first tunneling insulator (not shown) on the metal gate electrode 2004. A channel conductor 2012 is formed on the first tunneling insulator. Source/drain electrodes 2008, 2010 are arranged, in part, on the channel conductor 2012 and, in part, on a surface of the first tunneling insulator. The source/drain electrodes 2008, 2010 overlap the metal gate electrode 2004.

In another embodiment, an AMTFT structure is used in an active matrix organic light emitting diode (AMOLED) circuit. As will be understood, AMOLED circuits can have a variety of structures that include different numbers of transistors and capacitors (e.g., 2 transistors and 1 capacitor; 5 transistors and 2 capacitors; 6 transistors and one capacitor; etc.). In various embodiments, any one or more of the transistors of an AMOLED circuit can be an AMTFT. In embodiments, one of the transistors is an AMTFT. In embodiments, two of the transistors are AMTFTs. In embodiments, three of the transistors are AMTFTs. In embodiments, four of the transistors are AMTFTs. In embodiments, five of the transistors are AMTFTs. In embodiments, six of the transistors are AMTFTs. In further embodiments, all of the transistors are AMTFTs.

Figure 21A:
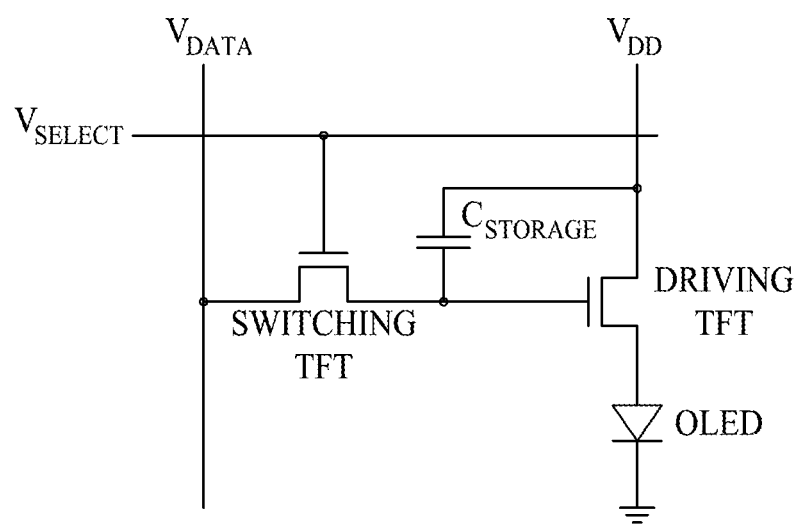
FIG. 21A shows a circuit diagram for an exemplary AMOLED circuit.
Figure 21C:
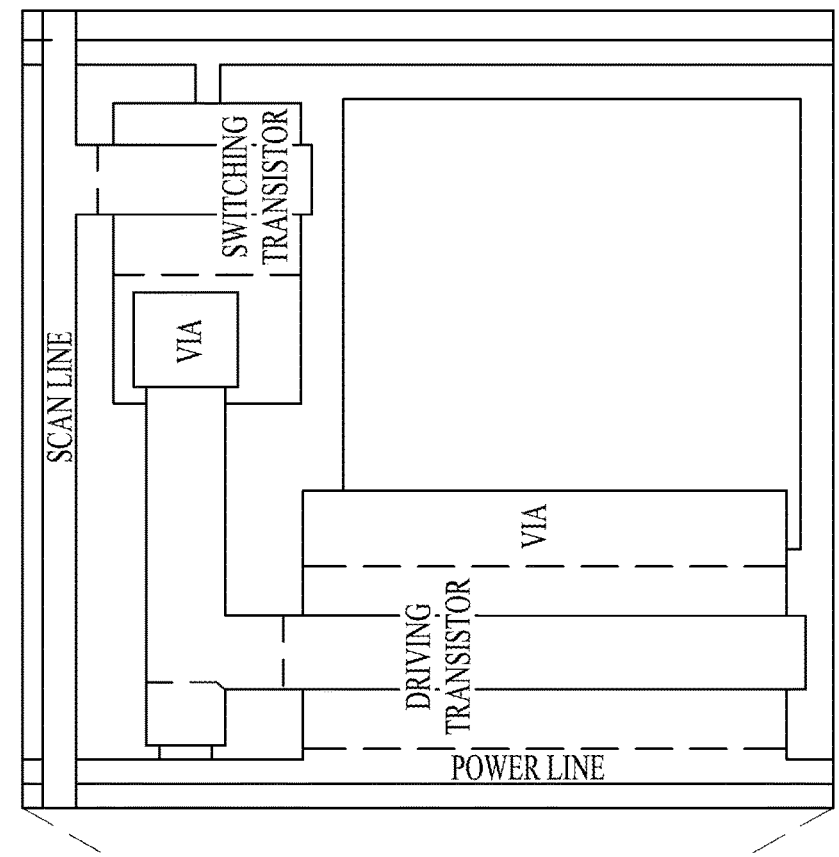
FIG. 21C shows a single pixel circuit of the array, as indicated by the rectangle in FIG. 21B.
Figure 21B:
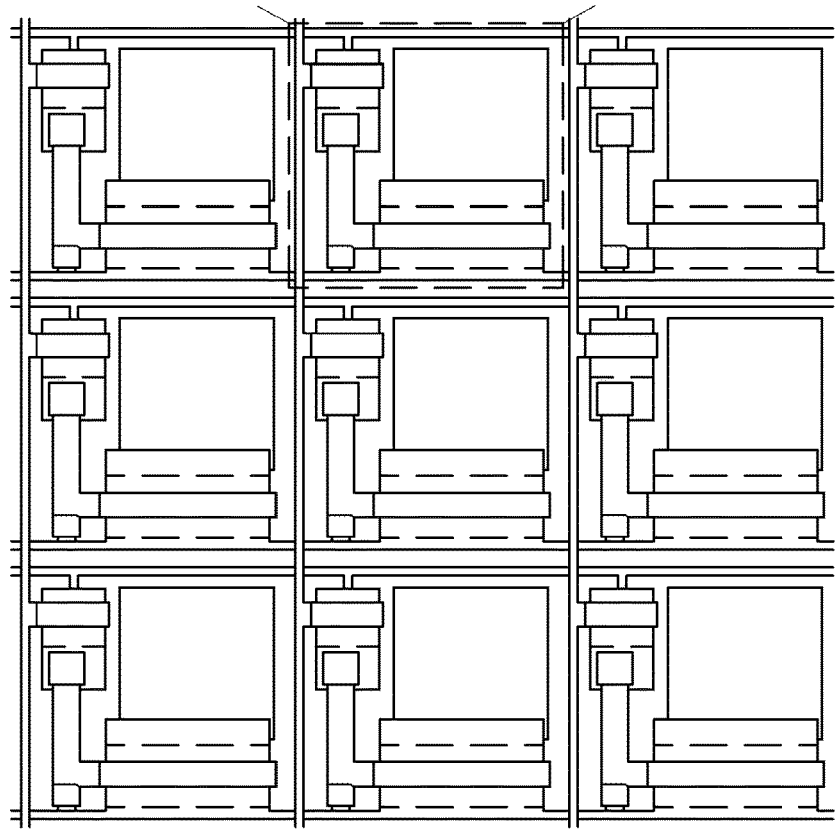
FIG. 21B shows a top down view of an illustrative matrix of AMOLED structures.

FIG. 21A shows a circuit diagram for an exemplary AMOLED circuit. As can be seen in FIG. 21A, this circuit includes two transistors and one capacitor. In various embodiments, the switching TFT, driving TFT, or both are AMTFTs. FIG. 21B shows a top down view of an illustrative matrix of AMOLED structures. FIG. 21C shows a single pixel circuit of the array, as indicated by the rectangle in FIG. 21B.

Figure 22:
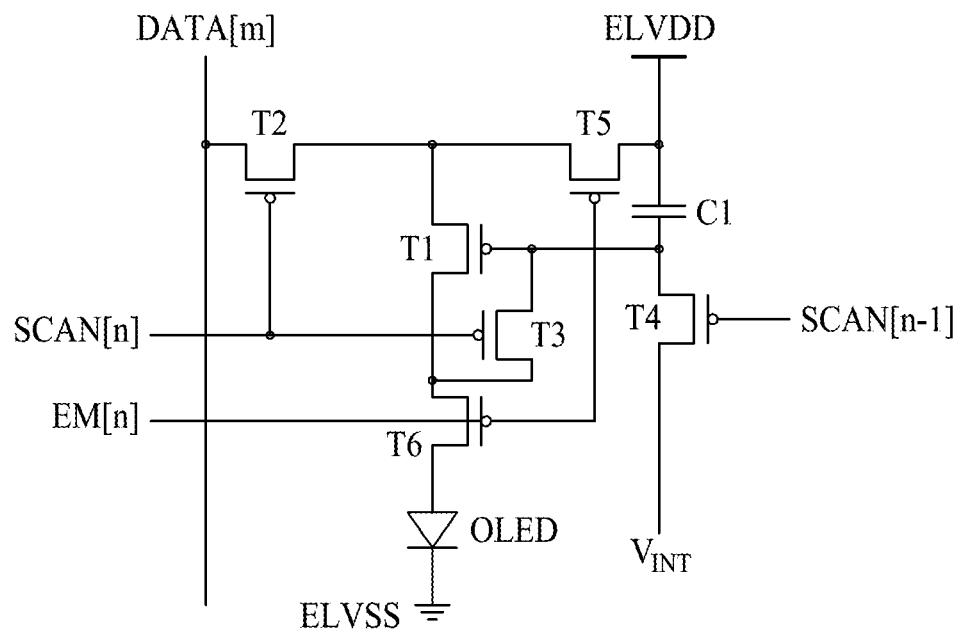
FIG. 22 shows a second exemplary AMOLED circuit, which includes six transistors and one capacitor.

A second exemplary AMOLED circuit, which includes six transistors and one capacitor, is shown in FIG. 22.

Figure 23:
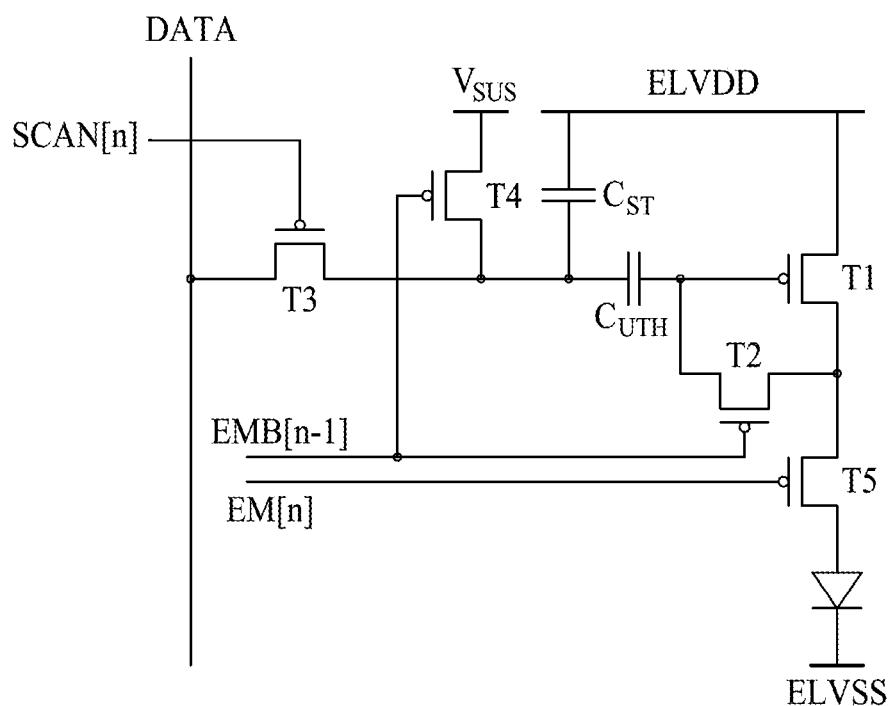
FIG. 23 shows a third exemplary AMOLED circuit, which includes five transistors and two capacitors.

A third exemplary AMOLED circuit, which includes five transistors and two capacitors, is shown in FIG. 23.

Figure 24A:
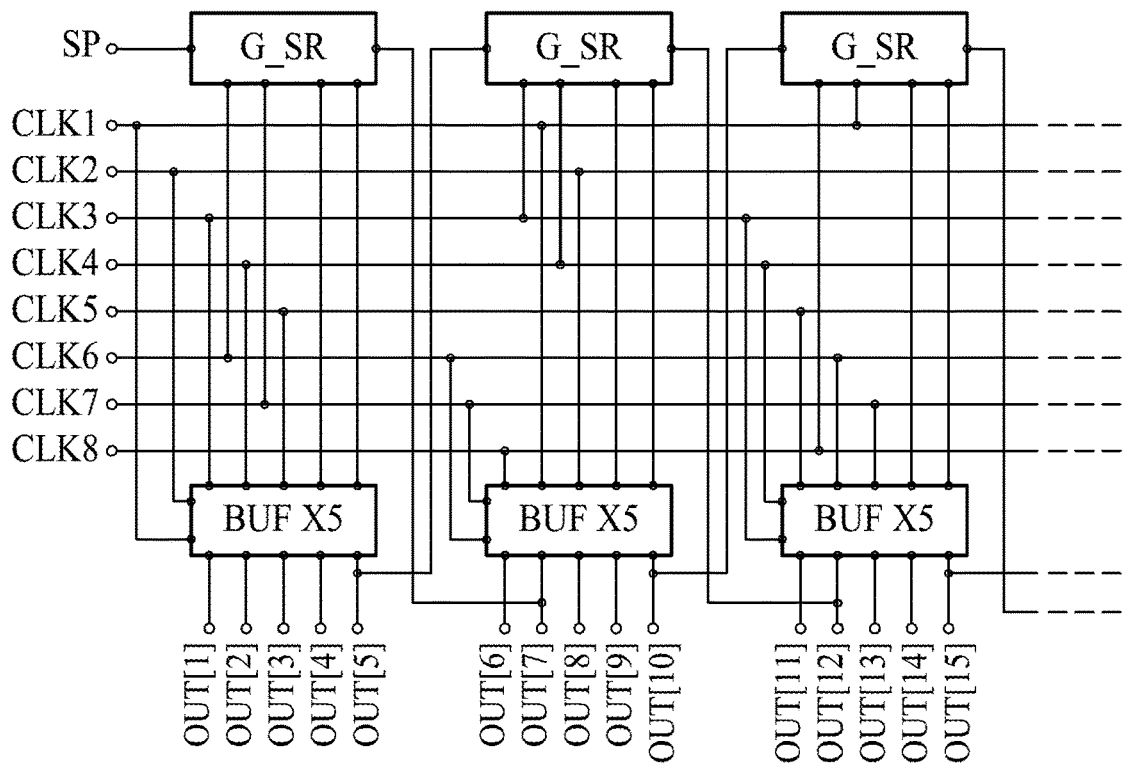
FIG. 24A shows an exemplary gate driver circuit block diagram.
Figure 24B:
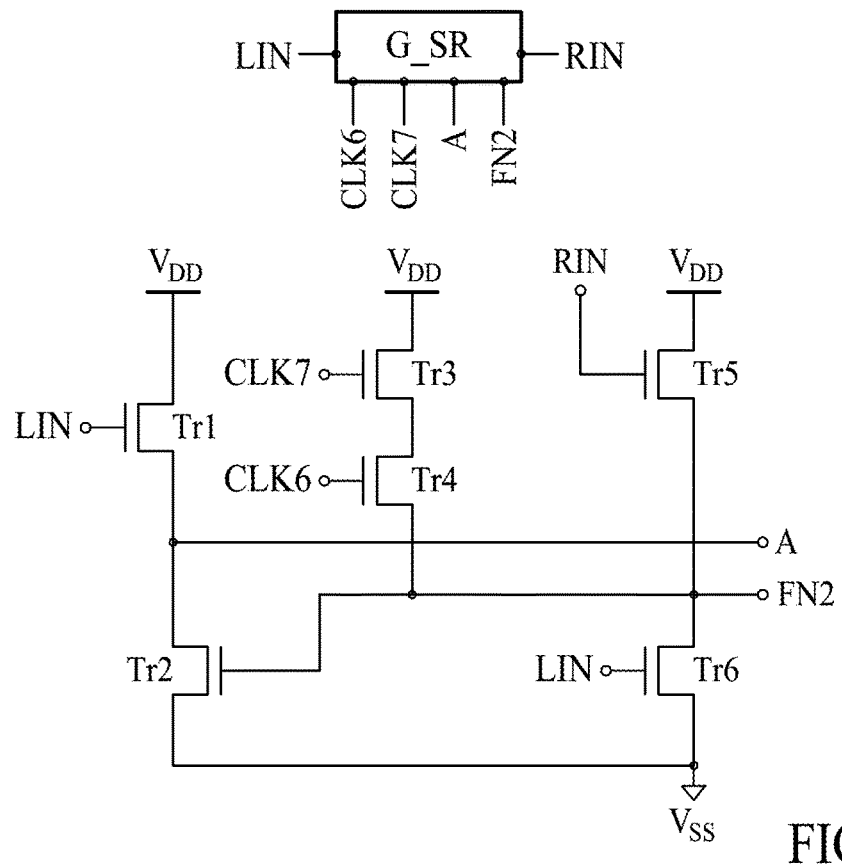
FIG. 24B shows an illustrative gate driver shift register circuit.
Figure 24C:
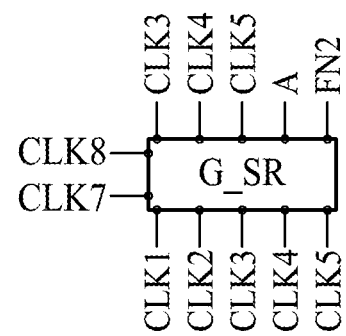
FIG. 24C shows an example of a gate driver buffer circuit in which an AMTFT may be used.
Figure 24C:
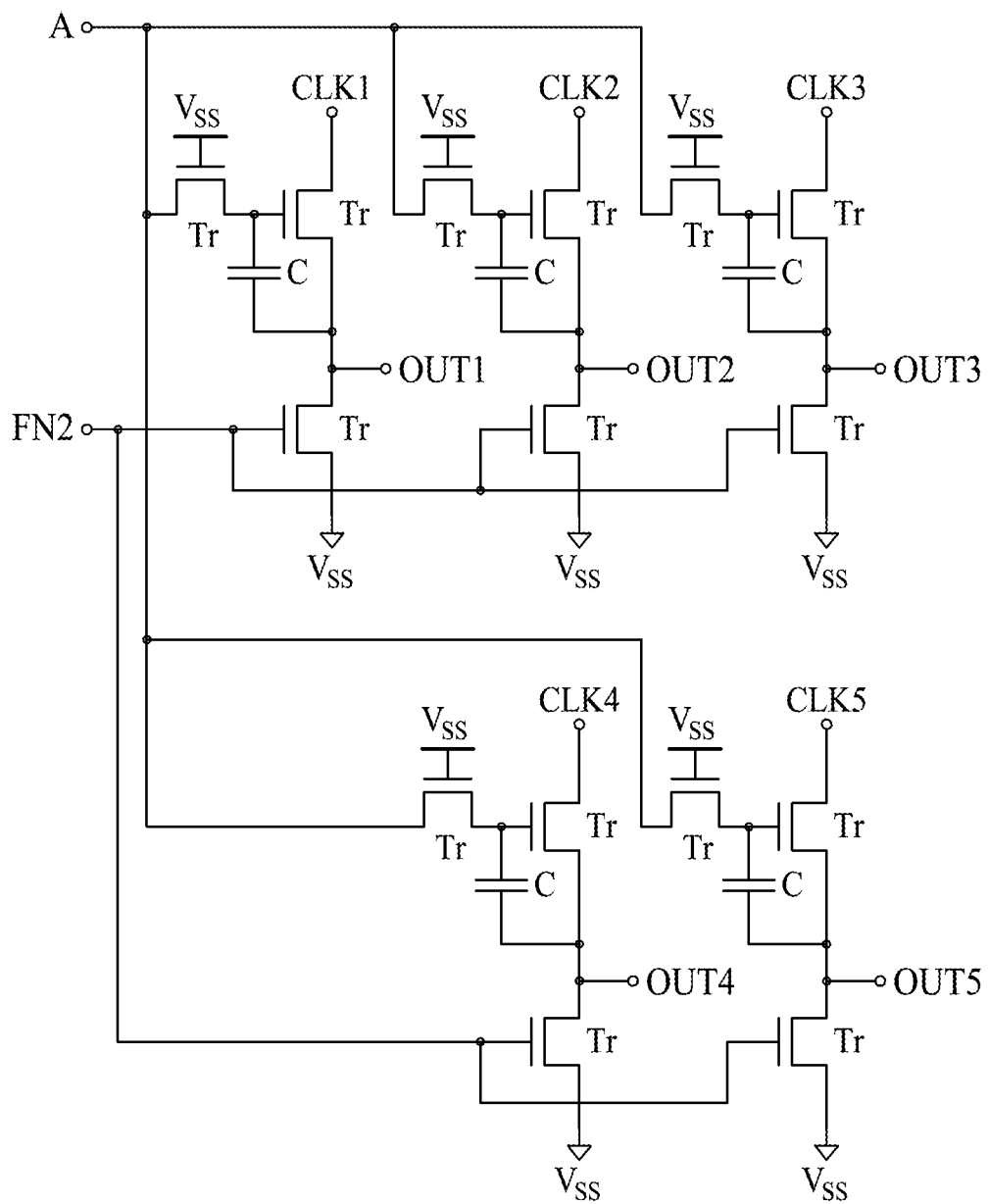

In still further embodiments, the AMTFTs described herein are used in gate driver circuits. An exemplary gate driver circuit block diagram is shown in FIG. 24A, which includes shift registers (G_SR), clock lines (CLK), and buffers (BUF X5). An illustrative gate driver shift register circuit is shown in FIG. 24B. In various embodiments, any one or more of the transistors shown are AMTFTs. In other words, any of Tr1, Tr2, Tr3, Tr4, Tr5, Tr6, or a combination thereof are AMTFTs. FIG. 24C shows an example of a gate driver buffer circuit in which an AMTFT may be used.

In additional embodiments, source driver circuits include one or more AMTFTs.

Figure 25:
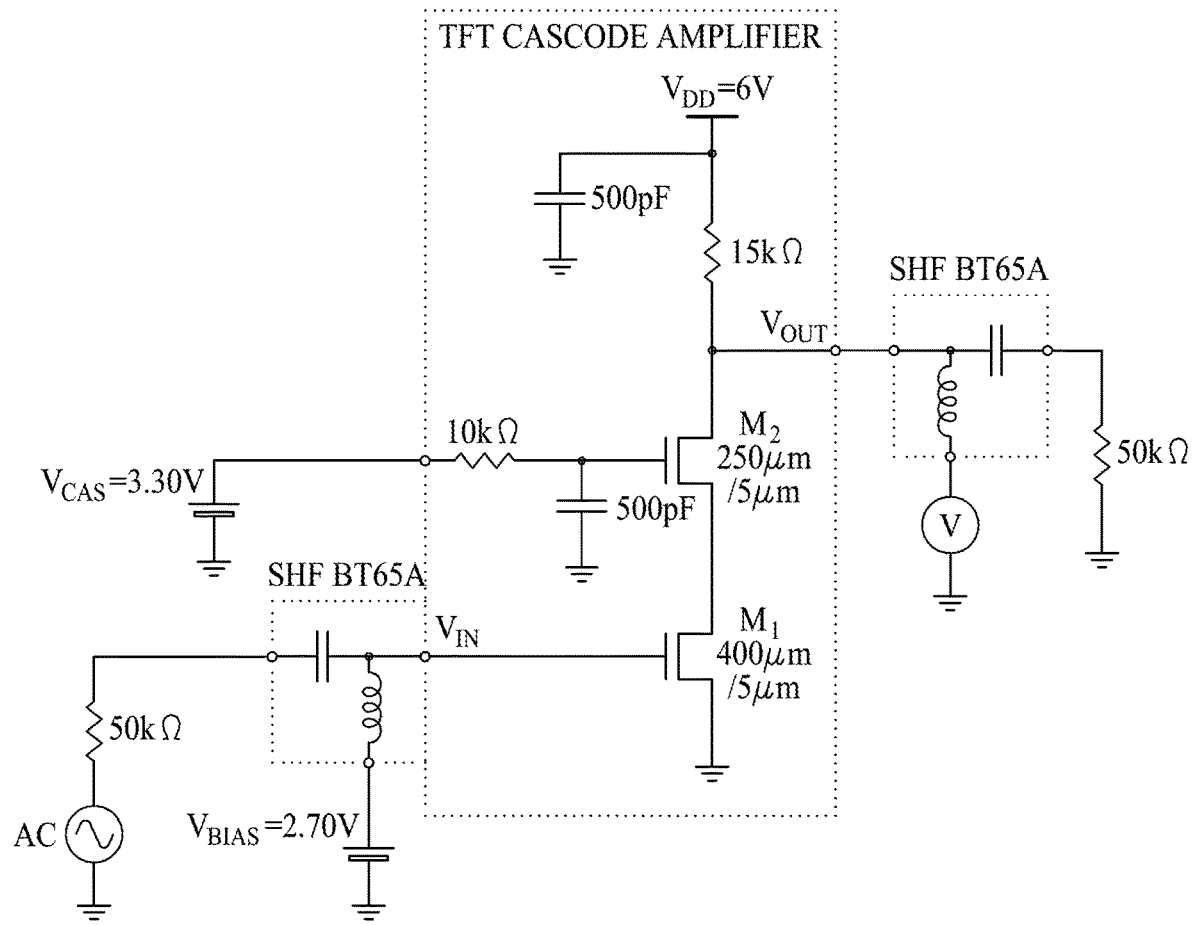
FIG. 25 shows an exemplary circuit diagram of a cascode amplifier circuit.

In further embodiments, a cascode amplifier circuit includes one or more AMTFTs. An exemplary circuit diagram of a cascode amplifier circuit is shown in FIG. 25.

In embodiments where a substrate is deformed in more than one location, a corresponding number of angles may be measured. In some embodiments, the flexible substrate is deformed to an angle of at least +/−10 degrees. In some embodiments, the flexible substrate is deformed to an angle of at least +/−15 degrees. In some embodiments, the flexible substrate is deformed to an angle of at least +/−20 degrees. In some embodiments, the flexible substrate is deformed to an angle of at least +/−25 degrees. In some embodiments, the flexible substrate is temporarily, such as in use, or permanently deformed to an angle in the range of 45-90 degrees. In some embodiments, the flexible substrate is deformed to an angle of greater than 90 degrees.

"About," as used herein, denotes that the actual value may be somewhat more or somewhat less than the stated value or range, to within ±20% of the stated value. In embodiments, about means that the actual value is within ±15% of the stated value. In embodiments, about means that the actual value is within ±10% of the stated value. In embodiments, about means that the actual value is within ±5% of the stated value. In embodiments, about means that the actual value is within ±1% of the stated value. In some embodiments, the first tunneling insulator is no more than about 15 nanometers (nm). In some embodiments, the first tunneling insulator is no more than about 10 nanometers (nm).

In some embodiments, the first tunneling insulator is about 20 nanometers (nm). In some embodiments, the first tunneling insulator is about 15 nanometers (nm). In some embodiments, the first tunneling insulator is about 10 nanometers (nm).

The present disclosure is directed to embodiments that includes a non-conducting substrate, an amorphous metal gate electrode on the substrate, and a channel conductor. The embodiments include a first tunneling insulator on the amorphous metal gate electrode. Source and drain electrodes are on the first tunneling insulator in some embodiments. The source and drain electrodes are overlapping the amorphous metal gate electrode. The source and drain electrodes are between the first tunneling insulator and the channel conductor in some embodiments.

The source and drain electrodes are on the first tunneling insulator and the channel conductor and are overlapping the amorphous metal gate electrode. A second tunneling insulator may be on the channel conductor. The second insulator is on the first tunneling insulator. In some embodiments, a second gate electrode is on the second tunneling insulator. The second tunneling insulator may be on the source and drain electrodes.

In some embodiments, a second gate electrode is on a third insulator. A second tunneling insulator may be on the second gate electrode and the channel conductor. Source and drain electrodes may be on the second tunneling insulator. In some embodiments, the source and drain electrodes abut the one or more portions of the channel conductor that are exposed. Other embodiments include an amorphous metal interconnect adjacent to the amorphous metal gate electrode on the non-conducting substrate, where the amorphous metal interconnect is between the first tunneling insulator and the non-conducting substrate.

Some embodiments include a non-conducting substrate with an amorphous metal source electrode, an amorphous metal drain electrode, and a channel conductor. A first tunneling insulator is on the amorphous metal source electrode and the amorphous metal drain electrode. A gate electrode is on the first tunneling insulator. A second tunneling insulator may be between the non-conducting substrate and the channel conductor.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
forming an amorphous metal alloy gate electrode on a flexible substrate;
forming an aluminum oxide insulating layer on the amorphous metal alloy gate electrode, the aluminum oxide insulating layer having a first surface and a second surface opposite the first surface, a third surface and a fourth surface opposite the third surface, the second surface facing the amorphous metal alloy gate electrode, the third surface and the fourth surface extending from the first surface;
forming a channel conductor on the aluminum oxide insulating layer to cover the first, third, and fourth surfaces of the aluminum oxide insulating layer;
forming either a source electrode or a drain electrode on the aluminum oxide insulating layer so that either the source electrode or the drain electrode overlaps the amorphous metal alloy gate electrode at a selected distance from a plan view;
wherein the channel conductor, the amorphous metal alloy gate electrode, and at least one of the source electrode or the drain electrode overlaps each other at the selected distance from a plan view.

2. The method of claim 1, wherein forming the channel conductor including forming the channel conductor such that the channel conductor directly contacts the first, third, and fourth surfaces of the aluminum oxide insulating layer.

3. The method of claim 1, further including forming an insulating layer on the channel conductor and the source and drain electrodes.

4. A method, comprising:
forming a first insulator layer having a first planar surface on a non-conductive substrate;
forming an amorphous metal alloy source electrode on the first planar surface of the first insulator layer on the non-conducting substrate;
forming an amorphous metal alloy drain electrode on the first planar surface of the first insulator layer on the non-conducting substrate;
forming a channel conductor overlapping with the amorphous metal alloy source electrode and the amorphous metal alloy drain electrode, the channel conductor being in direct contact with the first planar surface of the first insulator, the channel conductor having a second planar surface opposite the first planar surface of the first insulator;
forming a first aluminum oxide insulator on the amorphous metal alloy source electrode and the amorphous metal alloy drain electrode, the first aluminum oxide insulator including a trench-like shaped portion; and
forming a gate electrode on the first aluminum oxide insulator,
wherein at least a portion of the gate electrode extends into the trench-like shaped portion of the first aluminum oxide insulator, and
wherein either the amorphous metal alloy drain electrode or the amorphous metal alloy source electrode is in direct contact with the second planar surface of the channel conductor.

5. The method of claim 4, wherein the gate electrode being an amorphous metal alloy.

6. The method of claim 5, further including forming a second aluminum oxide insulator on the non-conducting substrate before forming the channel conductor.

7. A device, comprising:
a non-conductive flexible substrate;
a first titanium aluminum amorphous metal electrode;
an aluminum oxide insulating layer in direct contact with the non-conductive flexible substrate;
an InGaZnO channel conductor having a first surface and a second surface opposite the first surface, the second surface of the InGaZnO channel conductor in direct contact with the aluminum oxide insulating layer;
a first metal oxide electrode on a first end of the InGaZnO channel conductor, the first metal oxide electrode having a third surface;
a second metal oxide electrode on a second end of the InGaZnO channel conductor, the second metal oxide electrode having a fourth surface opposite the third surface of the first metal oxide electrode, the first metal oxide electrode being spaced from the second metal oxide electrode, the third surface of the first metal oxide electrode and the fourth surface of the second metal oxide electrode facing each other;
an insulating layer on the first and second metal oxide electrodes and the InGaZnO channel conductor, the insulating layer in direct contact with the first surface of the InGaZnO channel conductor and in direct contact with the third surface of the first metal oxide electrode and the fourth surface of the second metal oxide electrode,
wherein the first titanium aluminum amorphous metal electrode is on and contacting the insulating layer.

8. The device of claim 7 wherein the aluminum oxide insulating layer is between 10 and 20 nanometers.

9. The device of claim 7 wherein the titanium aluminum is $TiAl_3$.

10. The device of claim 7, wherein the channel conductor on the aluminum oxide insulating layer is approximately 20 nm.

11. The device of claim 7, further comprising an organic light emitting diode on the non-conducting flexible substrate.

12. The device of claim 7, wherein the channel conductor is wider than the first titanium aluminum amorphous metal electrode in a first direction.

13. The device of claim 7, comprising a second titanium aluminum amorphous metal electrode in direct contact with the non-conductive flexible substrate, the aluminum oxide insulating layer in direct contact with the second titanium aluminum amorphous metal electrode.

14. The device of claim 13, wherein the source electrode, the drain electrode, the first electrode, and the second electrode are made of the same material.

* * * * *